United States Patent [19]
Jansen et al.

[11] Patent Number: 5,585,709
[45] Date of Patent: Dec. 17, 1996

[54] METHOD AND APPARATUS FOR TRANSDUCERLESS POSITION AND VELOCITY ESTIMATION IN DRIVES FOR AC MACHINES

[75] Inventors: Patrick L. Jansen, Marathon; Robert D. Lorenz, Madison, both of Wis.

[73] Assignee: Wisconsin Alumni Research Foundation, Madison, Wis.

[21] Appl. No.: 173,405

[22] Filed: Dec. 22, 1993

[51] Int. Cl.[6] .................................................. H02P 5/28
[52] U.S. Cl. ........................................... 318/807; 318/720
[58] Field of Search .................................... 318/701, 721, 318/729, 811, 806, 810, 809, 803, 805, 807, 720, 723

[56] References Cited

U.S. PATENT DOCUMENTS

| | | |
|---|---|---|
| 3,597,646 | 8/1971 | Lawrenson . |
| 3,611,138 | 10/1971 | Winebrener . |
| 3,943,504 | 3/1976 | Vosicky . |
| 4,149,114 | 4/1979 | Gorjan . |
| 4,447,787 | 5/1984 | Schwesig et al. ....................... 318/803 |
| 4,450,396 | 5/1984 | Thornton . |
| 4,520,302 | 5/1985 | Hill et al. . |
| 4,612,486 | 9/1986 | Ban et al. . |
| 4,761,703 | 8/1988 | Kliman et al. ........................... 318/806 |
| 5,029,265 | 7/1991 | Stoats ..................................... 318/729 |
| 5,053,690 | 10/1991 | Mutch et al. ........................... 318/811 |
| 5,070,264 | 12/1991 | Conrad . |
| 5,144,564 | 9/1992 | Naidu et al. ............................ 318/721 |
| 5,196,775 | 3/1993 | Harris et al. . |
| 5,256,923 | 10/1993 | Bartos et al. ........................... 318/701 |
| 5,272,429 | 12/1993 | Lipo et al. . |
| 5,294,876 | 3/1994 | Jönsson .................................. 318/809 |
| 5,334,923 | 8/1994 | Lorenz et al. . |

OTHER PUBLICATIONS

Robert D. Lorenz, et al., "High–Resolution Velocity Estimation for All–Digital, ac Servo Drives", IEEE–IAS Annual Meeting, Oct. 1988, pp. 363–368.

John G. Bollinger, et al., *Computer Control of Machines and Processes* (book), Addison–Wesley Publishing Company, Reading, MA, 1990, pp. 275–278.

Analog Devices 1989/90 Data Conversion Products Databook, Synchro & Resolver Converters, AD2S90 Resolver–To–Digital Converter.

Robert M. Cuzner, et al., "Application of Non–Linear Observers for Rotor Position Detection on an Induction Motor Using Machine Voltages and Currents", Proc. IEEE–IAS Annual Meeting, Oct. 1990.

(List continued on next page.)

*Primary Examiner*—John W. Cabeca
*Attorney, Agent, or Firm*—Foley & Lardner

[57] ABSTRACT

Power is provided to the stator windings of an AC machine which includes a component at the fundamental drive frequency for the machine and a superimposed signal component which is at a substantially higher frequency than the drive power. The rotor has saliencies which result in a change in impedance as seen at the stator windings to the high frequency excitation signal as a periodic function of rotor rotational position. Such saliencies are inherent in some permanent magnet synchronous and all synchronous reluctance machines, and may be provided by appropriate modification of the rotor of induction machines. The stator response at the signal frequency is then detected to provide a correlation between the response at the signal frequency and the rotor position. The detection of the response at the signal frequency is preferably carried out by a heterodyne detection process, by mixing signals at the signal frequency with the measured stator currents, and filtering the mixed signals to isolate the signal indicative of the rotor position. Conventional squirrel cage induction motors can be provided with sufficient spatial variations in the stator winding impedance as a function of rotor position in various ways, including varying the depth and/or width of the slots over the rotor conductive bars, by varying the cross-section of the bars, or by filling or partially filling some of the slots.

31 Claims, 29 Drawing Sheets

OTHER PUBLICATIONS

P. L. Jansen, et al., "A Physically Insightful Approach to the Design and Accuracy Assessment of Flux Observers for Field Oriented Induction Machine Drives", Proc. IEEE–IAS Annual Meeting, Oct. 1992, pp. 570–577.

P. L. Jansen, et al., "Observer–Based Direct Field Orientation for Both Zero and Very High Speed Operation", PCC–Yokohama '93, Yokohama, Japan, Apr. 1993.

P. L. Jansen, et al., "Observer–Based Direct Field Orientation: Analysis and Comparison of Alternative Methods", IEEE–IAS '93 Annual Meeting, Toronto, Canada, Oct. 1993.

M. Schroedl, "Operation of the Permanent Magnet Synchronous Machine Without a Mechanical Sensor", Proc. Int. Conf. on Power Electronics and Variable Speed Drives, IEE, London, England, Jul. 1990, pp. 51–56.

Manfred Schroedl, "Control of a Permanent Magnet Synchronous Machine Using a New Position–Estimator", ICEM, Boston, Aug. 1990, pp. 1218–1224.

K. J. Binns, et al., "Implicit Rotor–Position Sensing Using Motor Windings for a Self–Commutating Permanent–Magnet Drive System", IEE Proceedings–B, vol. 138, No. 1, Jan. 1991, pp. 28–34.

Manfred Schroedl, "Sensorless Control of Induction Motors at Low Speed and Standstill", ICEM, Manchester, 1992, pp. 863–867.

M. Schroedl, et al., "Induction Motor Drive For Electric Vehicles Without Speed–and Position Sensors", European Power Electronics Conference, Brighton, England, Sep. 13, 1993, pp. 271–275.

*Corrected Citation* John G. Bollinger, et al., *Computer Control of Machines* and Processes (book), Addison–Wesley Publishing Company, Reading, MA, 1988, pp. 275–278.

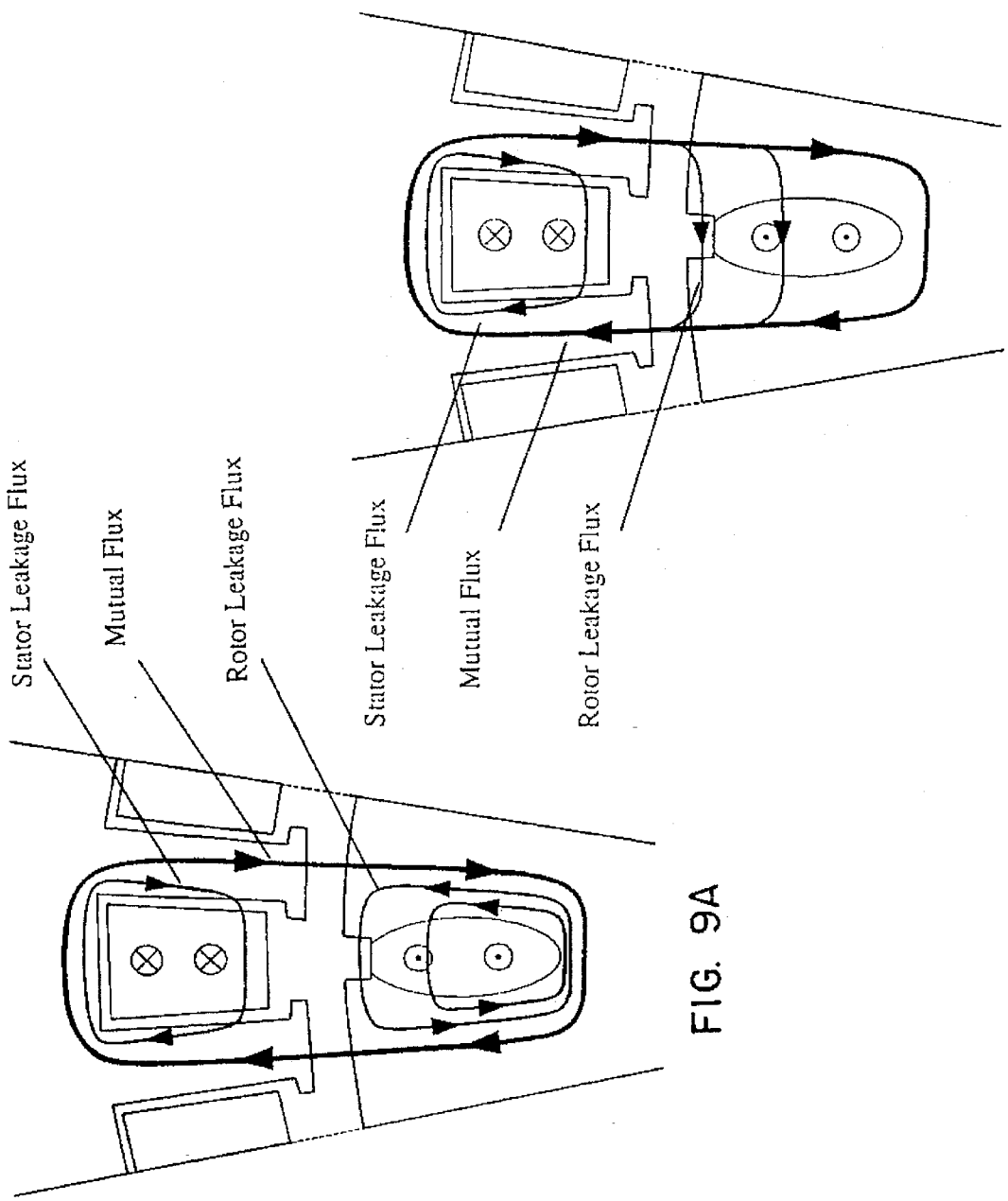

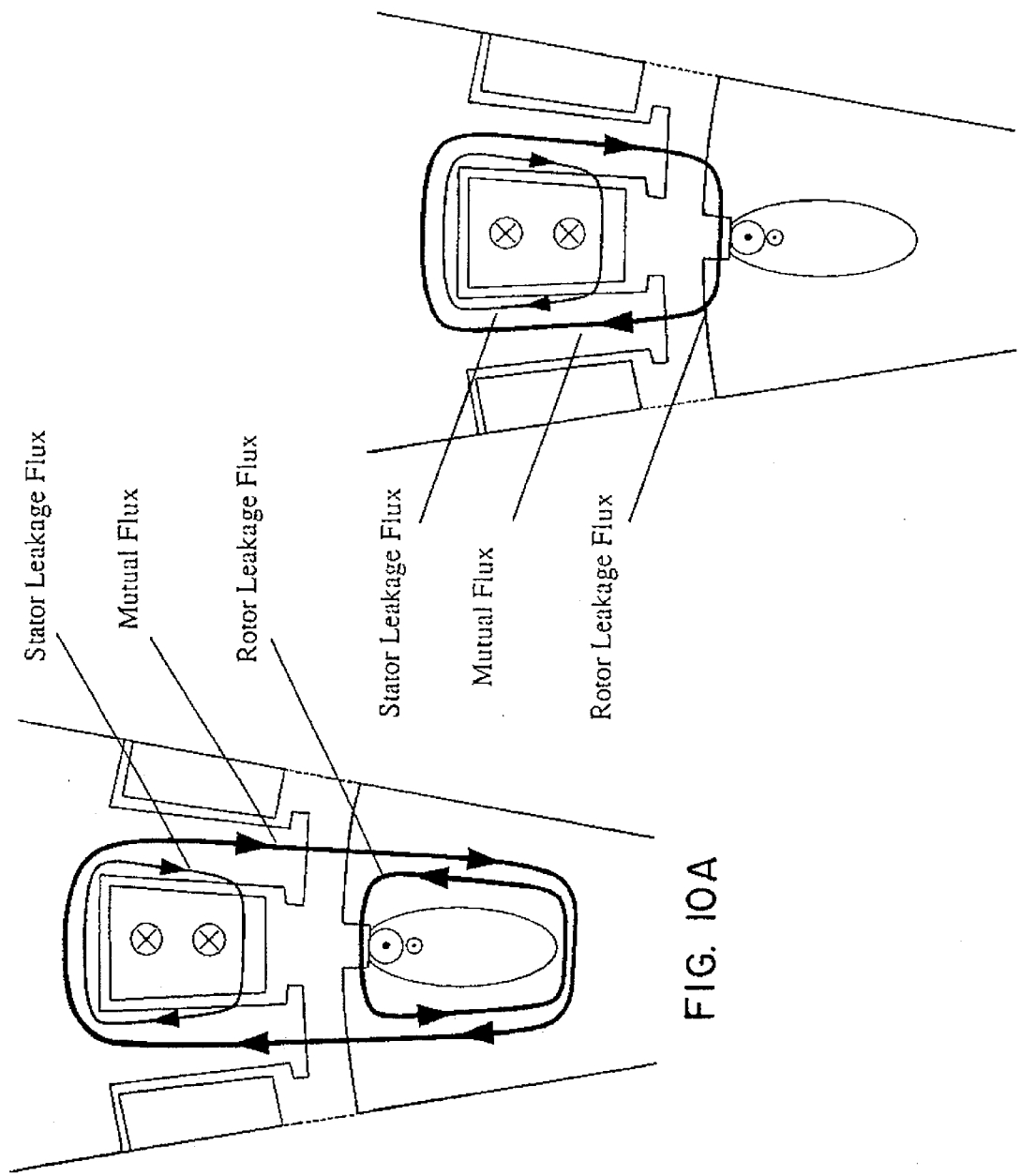

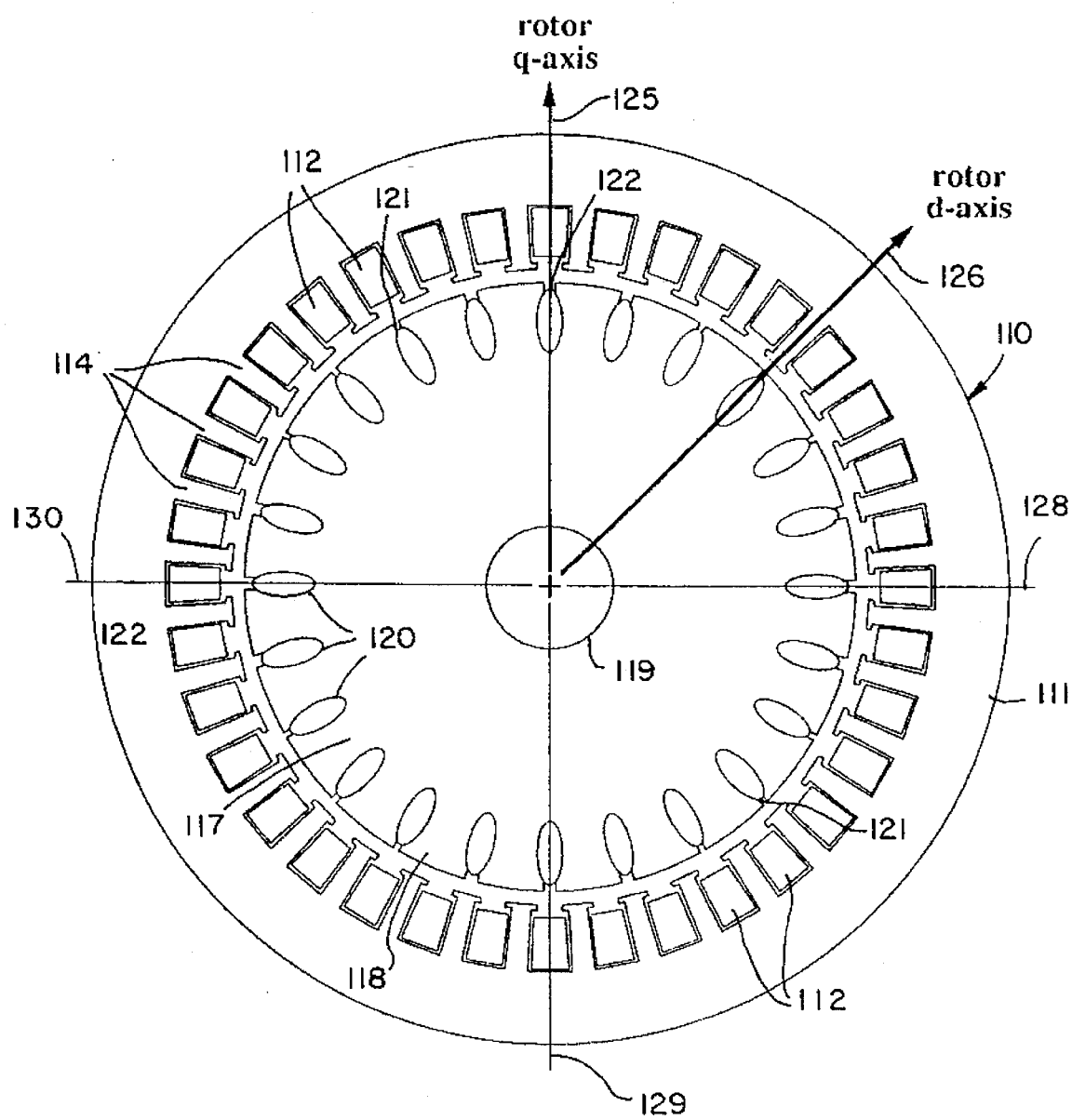

METHOD AND APPARATUS FOR TRANSDUCERLESS POSITION AND VELOCITY ESTIMATION IN DRIVES FOR AC MACHINES

This invention was made with United States Government support awarded by the National Science Foundation (NSF), Grant No. DDM-8912361. The United States Government has certain rights in this invention.

FIELD OF THE INVENTION

This invention pertains generally to the field of motor drive and control systems and to the determination of rotor speed and position in AC machines.

BACKGROUND OF THE INVENTION

A variety of drive systems for AC machines utilizing electronic switching to control the power applied to the machines are presently available commercially. These AC machine drives allow the speed and/or torque of the machine to be controlled to meet various requirements. Such machine drives typically require mechanical shaft transducers to provide feedback of shaft position and/or velocity. Feedback is required both for torque control (i.e., field orientation or vector control) and trajectory tracking. However, shaft transducers and the associated wiring to provide the signals from the shaft transducers to the electronic drive add significantly to the cost and rate of failure of the system, and also add to the total volume and mass of the machine at the work site. Because induction machines are generally lower in cost and more rugged than other machine types, to a large extent the advantages of induction machines are the most compromised by the addition of such transducers.

Consequently, the desirability of eliminating position or velocity transducers in motor motion control applications has long been recognized. Several approaches have been proposed to allow estimation of the rotor position or velocity. Some success, although limited, has been obtained with techniques for determining the rotor position in synchronous and reluctance machines, which are considerably less complex than induction machines and have inherent spatially dependent rotor properties that can be easily tracked. Estimation of rotor position and velocity in the induction machine, which is by far the most common machine type and thus has the most significant commercial potential, is complicated because of its smooth symmetric rotor and symmetric induced rotor currents and slip. Nonetheless, accurate and parameter insensitive position and velocity measurement in induction machines can only be obtained by tracking spatial phenomena within the machine.

SUMMARY OF THE INVENTION

In accordance with the present invention, a drive system for polyphase AC machines provides power to the stator windings of the machine which includes a component at the fundamental drive frequency and a superimposed signal component which is at a higher frequency and lower power than the drive power—preferably a frequency high enough and a power low enough that the signal component does not substantially affect the motion of the rotor. The rotor of the machine has saliencies which change the rotor impedance and affect the response of the stator windings to the excitation signal at the signal frequency as a function of rotor rotational position. Preferably, the rotor leakage inductance in inductance machines, and the synchronous inductances in synchronous machines, as seen by the stator windings changes as a periodic function of rotor rotational position. The stator response at the signal frequency may then be detected and measured to provide a correlation between the magnitude of the response at the signal frequency and the rotor position. The information on rotor position as a function of time (and, thus, also information on the velocity of the rotor) can be utilized in a controller to provide appropriate fundamental frequency drive power to the motor to drive it at a desired speed or torque, or to a desired position.

The present invention can be carried out utilizing machines having inherent rotor saliency, such as some permanent magnet synchronous machines and all synchronous reluctance machines. However, it is a particular advantage of the present invention that it may be utilized with induction machines by introducing saliencies in the rotor which primarily have effect only at the relatively high frequency of the additional excitation signal. For example, the rotor may be constructed to have a variation in the effective leakage inductance of the rotor, and hence impedance as seen by the stator windings, as a function of the position of the rotor with respect to the stator at the signal frequency, but may have a substantially uniform and symmetrical impedance characteristic at the fundamental drive and slip frequencies with torque controlled operation. At low slip frequencies corresponding to field oriented operation and at normal fundamental drive frequencies, the impedance tends to be dominated by the effective rotor resistance and not leakage inductance. Thus, even if the inductance varies somewhat, at these low frequencies the effect on impedance and motor operation is small. Such asymmetries or saliencies in the induction machine rotor can be introduced in various ways, including but not limited to variations in rotor slot width and depth around the periphery of the rotor, variations in the cross-section or geometry of the conductive bars around the rotor, and by opening up selected rotor slots, with other rotor slots between them being closed. Existing squirrel cage induction motors can be modified to carry out the present invention by, for example, selectively cutting slots in the rotor over selected rotor bars or cutting slots of varying width over the bars.

The detection of the response to the high frequency signal at the stator windings is preferably carried out utilizing heterodyne detection by mixing a polyphase signal which is a function of the injected signal frequency with the polyphase response signal, and filtering the mixed signal to isolate the modulation of the response to the signal frequency, which is correlated with the angular position of the rotor.

The drive system may include an inverter which can be controlled in a space vector, pulse width modulated manner to provide output voltage to the stator windings at both the fundamental drive frequency and at the signal frequency. The inverter may also be controlled to provide only the fundamental drive frequency power to the stator, and a separate signal generator may be connected to inject the high frequency signal into the stator windings.

The invention may also be embodied in a linear motor. One of the windings of the linear motor acts as a primary (as do the stator windings) inductively coupled to a relatively movable secondary winding (corresponding to the rotor conductors). The impedance seen by the primary varies as a function of the relative position of the secondary.

Further objects, features and advantages of the invention will be apparent from the following detailed description when taken in conjunction with the accompanying drawings.

BRIEF DESCRIPTION OF THE DRAWINGS

In the drawings:

FIGS. 9A and 9B are simplified views through a portion of an induction machine rotor and stator showing simplified flux paths for magnetic flux at the fundamental drive frequency.

FIGS. 10A and 10B are simplified views through a portion of an induction machine rotor and stator illustrating simplified flux paths for magnetic flux at the frequency of the high frequency excitation signal over one slot pitch.

FIG. 11 is a view of an illustrative four-pole squirrel cage induction motor in accordance with the invention which incorporates spatially variant rotor leakage inductance created by variation of the width of rotor slot openings.

DETAILED DESCRIPTION OF THE INVENTION

Figure 1:
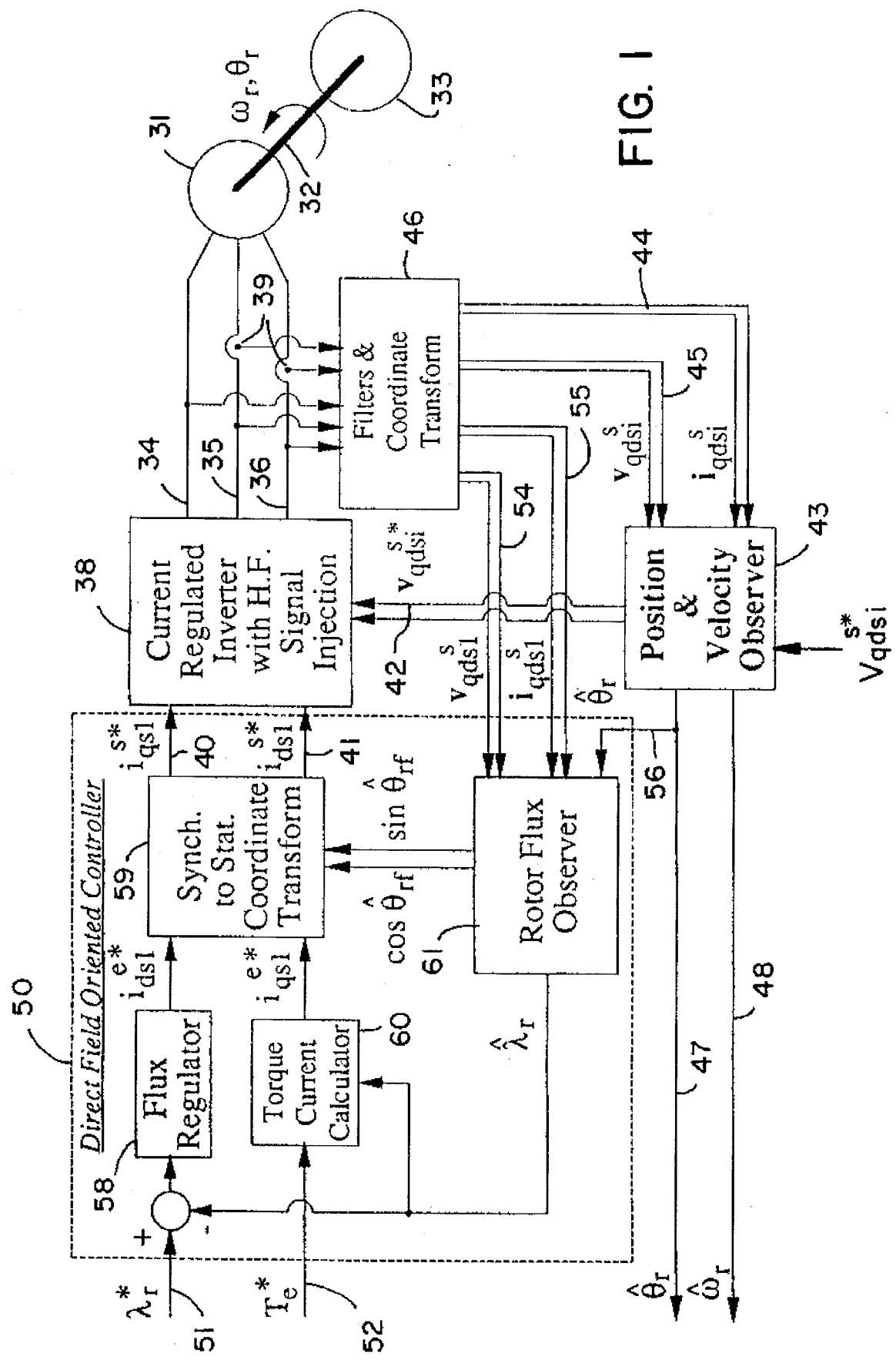
FIG. 1 is a schematic diagram of an exemplary transducerless torque controlled AC machine drive system in accordance with the invention which uses a direct field oriented controller based upon a rotor flux observer and a position and velocity observer.

A schematic diagram of a transducerless motor drive system in accordance with the invention is shown in FIG. 1. The motor drive system includes an AC motor 31 coupled by a shaft 32 to a load 33. The motor 31 is provided with balanced polyphase (three phase shown) power on output supply lines 34, 35 and 36 from an inverter drive system 38. Inverter systems for AC machines are well known and may be constructed in various ways, depending on the requirements for driving the motor 31. The motor 31 may be any of various types of machines that are capable of being driven with AC power, such as synchronous motors, including synchronous permanent magnet and synchronous reluctance motors, as well as induction motors which have characteristics which vary as a function of rotor position, as described further below. The inverter system 38 receives command signals for the fundamental frequency q and d axis currents $i^{s*}_{qsl}$ and $i^{s*}_{dsl}$ on lines 40 and 41, which may be provided as discussed further below, and higher frequency voltage command signals $V^{s*}_{qdsi}$ on lines 42 from a position and velocity observer 43.

Figure 27:
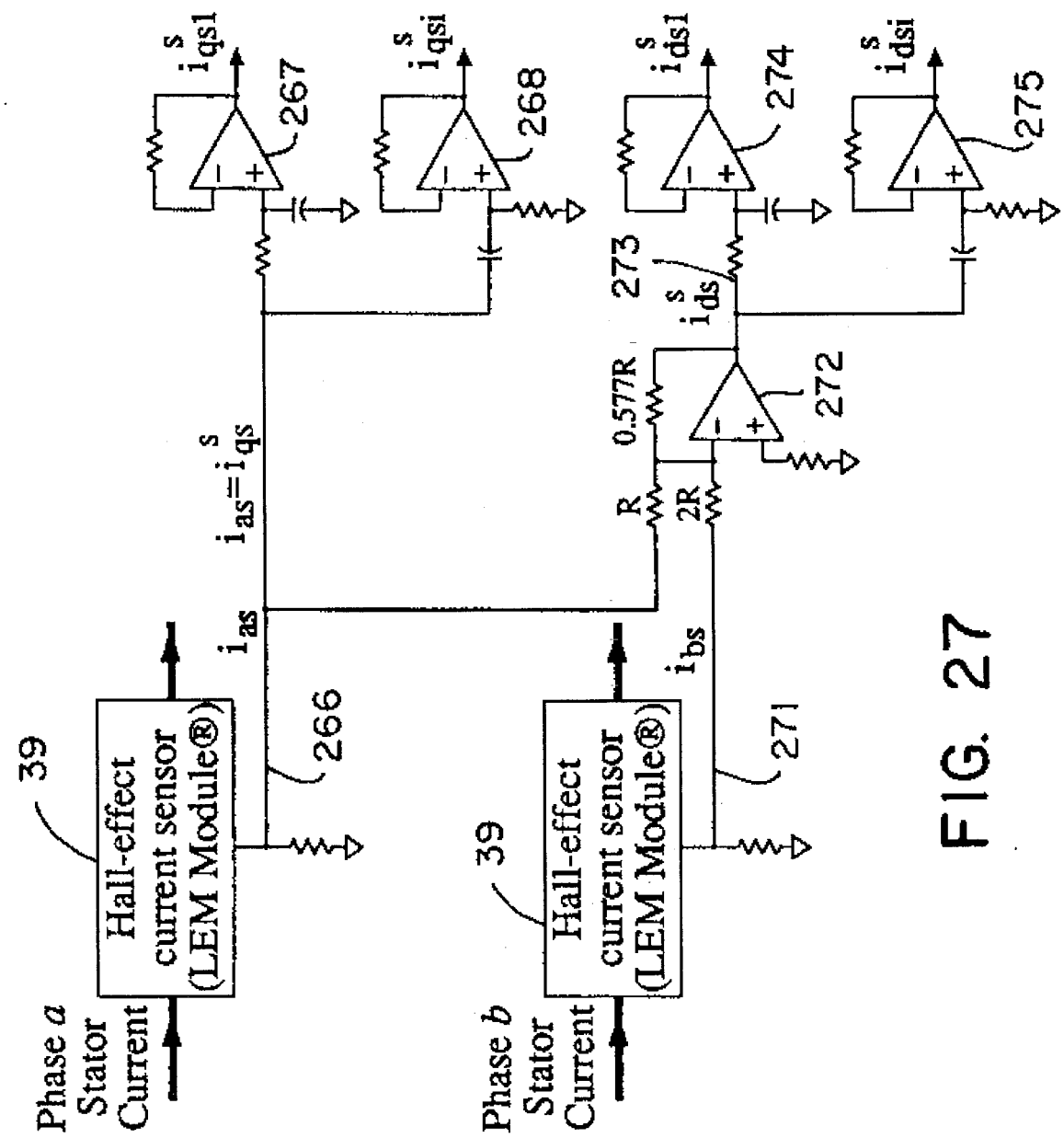
FIG. 27 is a schematic circuit diagram of an exemplary filter and coordinate transform circuit for the AC machine drive system of the invention, providing stator current sensing, three to two phase transformation, and isolation of signal and fundamental current components by first order high pass and low pass filtering.

The position and velocity observer 43 receives excitation signal (high) frequency current and voltage signals, denoted $i^s_{qdsi}$ and $V^s_{qdsi}$, on lines 44 and 45 from a filter and coordinate transform circuit 46 which is connected to the lines 34, 35 and 36 to measure the voltages on these lines, and which is also connected to current sensors 39 (e.g., Hall effect sensor or current transformers) to detect the currents in the lines 35 and 36 (and thereby the current in the line 34) The signal $i^s_{qdsi}$ is composed of two current signals, $i^s_{qdsi}$ and $i^s_{dsi}$, which are provided by the circuit 46 by a coordinate transformation which converts the measured three phase motor currents to the equivalent q-axis and d-axis currents. The signal $V^s_{qdsi}$ is composed of two voltage signals $V^s_{qsi}$ and $V^s_{dsi}$ which is provided by the circuit 46 through a coordinate transformation which converts the measured voltages on the lines 34, 35 and 36 to the equivalent q-axis and d-axis voltages. The circuit 46 may be of standard construction well known in the art, an example of which for providing the current signals $i^s_{qdsi}$ $i^s_{qdsi}$ is shown in FIG. 27 as discussed further below. In the present invention, the position and velocity observer 43, discussed further below, uses information from the signals on the lines 44 and 45 to provide estimates $\hat{\theta}_r$ and $\hat{\omega}_r$ for the rotor position and speed, respectively, which are provided as output signals on lines 47 and 48.

The current command signals $i^{s*}_{qsl}$ and $i^{s*}_{dsl}$ may be illustratively provided from a direct field oriented controller 50 of conventional design which receives flux command signals $\lambda^*_r$ on a line 51 and the desired torque $T^*_c$ on a line 52, and which also receives feedback information from the filter and coordinate transform circuit 46 of the fundamental (low) frequency voltage $V^s_{qdsl}$ on a line 54 and the fundamental frequency current $i^s_{qdsl}$ on a line 55, as well as the estimated rotor position $\hat{\theta}_r$ on a line 56. The term $V^s_{qdsl}$ represents two voltage signals $V^s_{qsl}$ and $V^s_{dsl}$, which are the q-axis and d-axis voltages provided by the circuit 46 by coordinate transformation of the three phase voltages between the lines 34, 35 and 36. As illustrated in FIG. 1, the direct field oriented controller includes a flux regulator 58, a synchronous to stationary coordinate transform unit 59, a torque current calculator 60, and a rotor flux observer 61. These units, of standard design, are connected as shown in FIG. 1 to provide the fundamental frequency current command signals $i^{s*}_{qsl}$ and $i^{s*}_{dsl}$ to the inverter 38. It is understood that the particular controller used is a matter of choice, and the position and velocity observer of the present invention may be used to provide useful motor position and/or speed information even without a controller.

Figure 2:
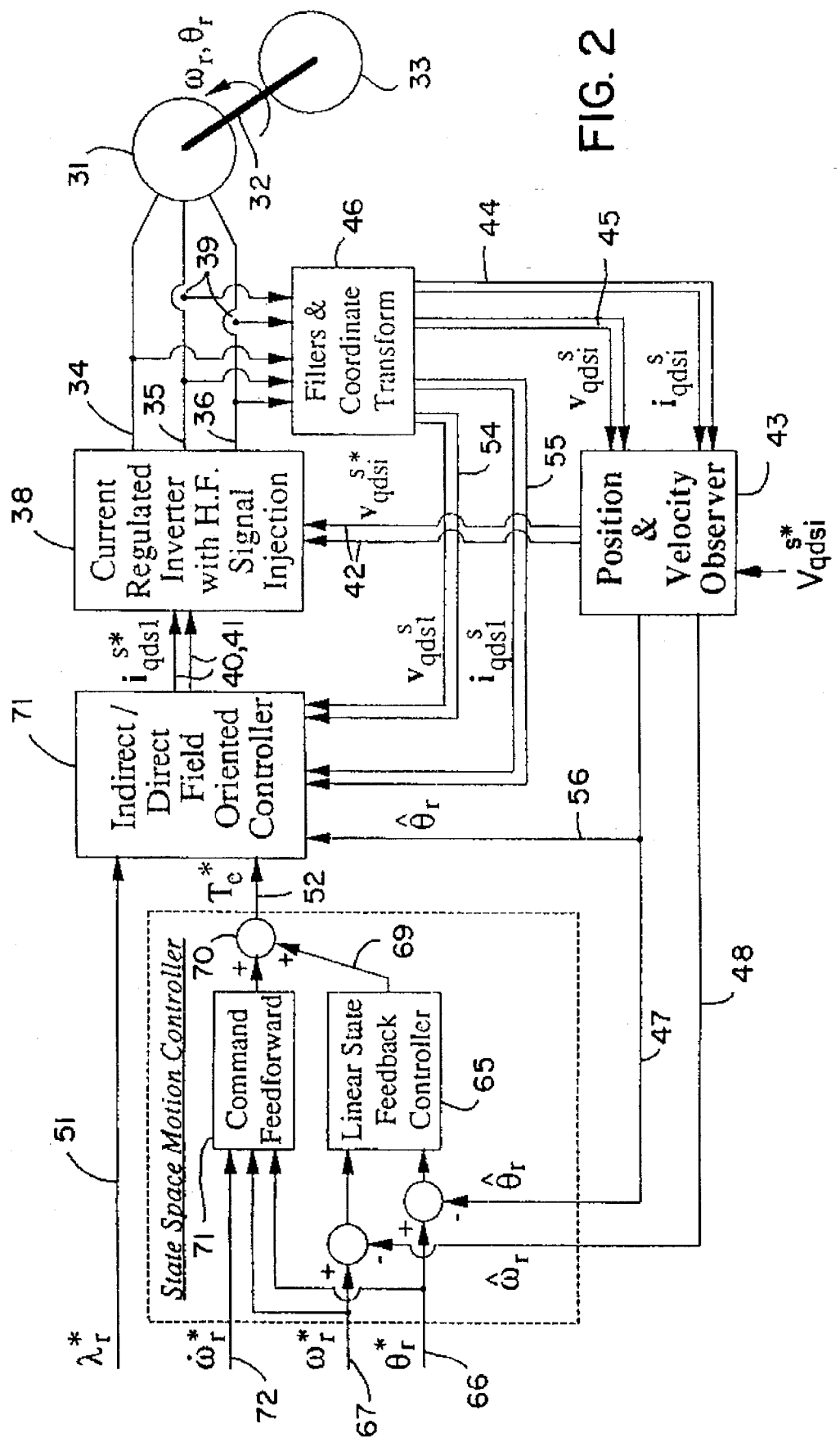
FIG. 2 is a schematic diagram of a transducerless AC machine drive motion control system in accordance with the invention which uses an observer based direct or indirect field oriented controller and a position and velocity observer in accordance with the invention.

As illustrated in FIG. 2, a full transducerless motion controlled AC machine drive may further utilize a linear feedback controller 65 which receives the difference between the estimated position $\hat{\theta}_r$ and velocity $\hat{\omega}_r$ (provided on the lines 47 and 48, respectively), and the desired position signal $\theta^*_r$ and velocity $\omega^*_r$ (provided on lines 66 and 67, respectively). The output of the linear state feedback controller 65 is provided on a line 69 to a summing junction 70 which also receives the output of a command feedforward unit 71, one input of which on a line 72 is a desired acceleration signal $\dot{\omega}^*_r$. The command feed forward unit 71 also receives the desired position and velocity signals $\theta^*_r$ and $\omega^*_r$. The output of the summing junction 70, a torque command signal $T^*_c$, is provided to the field oriented controller 71, which may be a direct controller such as the controller 50 of FIG. 1, or an indirect controller.

Figure 3:
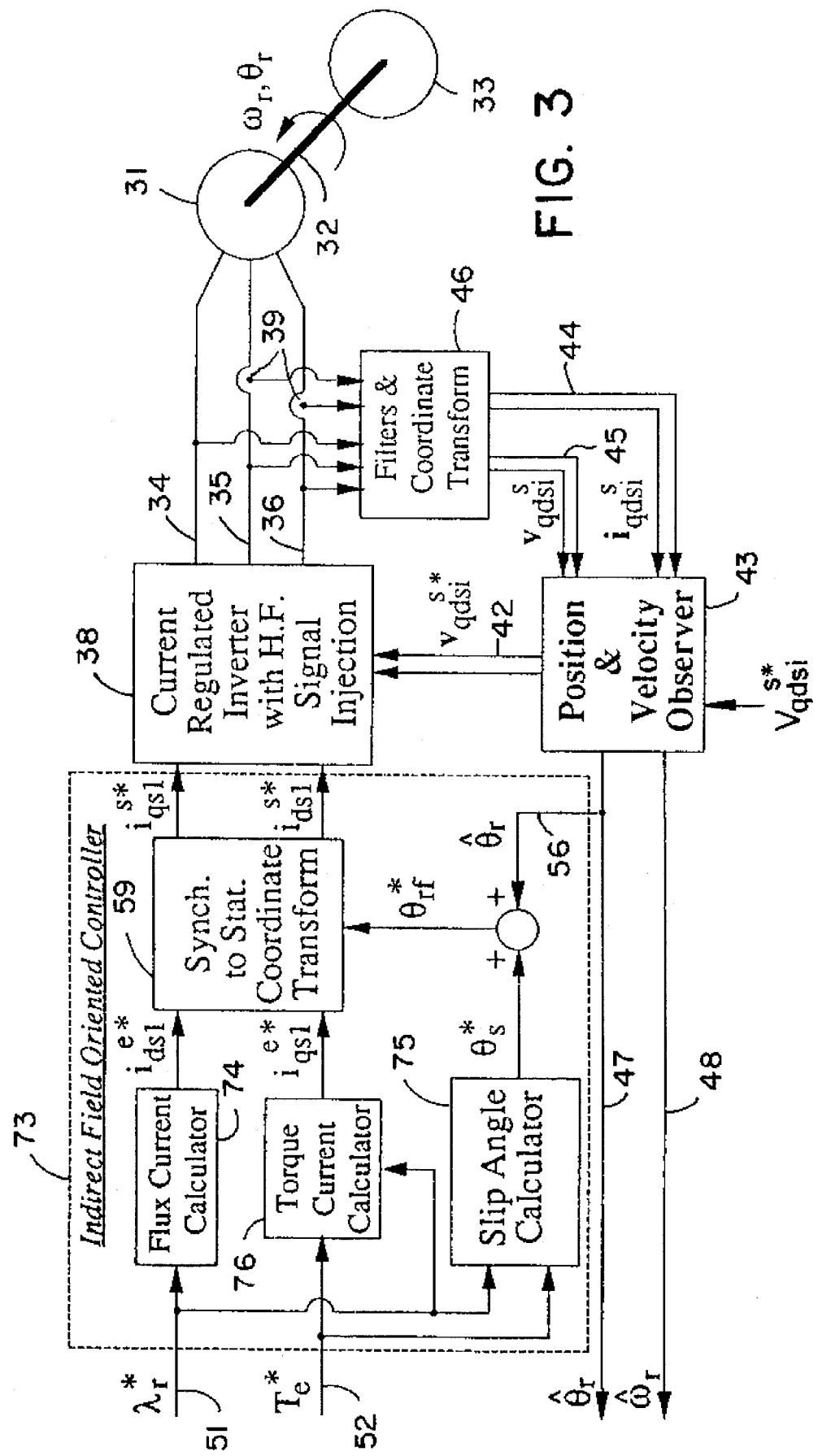
FIG. 3 is a schematic diagram of a torque controlled transducerless AC machine drive system in accordance with the invention which uses an indirect field oriented controller and a position and velocity observer in accordance with the invention.

Another implementation of a controller in a transducerless torque controlled induction machine drive system is shown in FIG. 3. This system utilizes an indirect field oriented controller 73. System inputs are torque $T^*_c$ and flux level $\lambda^*_r$ commands. The flux command $\lambda^*_r$ is received by a flux current calculator 74 which provides an output current signal $i^{e*}_{dsl}$ to a synchronous to stationary coordinate transform circuit 59. The flux command $\lambda^*_r$ and the torque command $T^*_c$ are received by a slip angle calculator 75 which provides a calculated slip angle $\theta^*_s$ to a summer which also receives the observed position signal $\hat{\theta}_r$ from the position and velocity observer 43. The output of the summer, $\theta^*_{rf}$, is provided to the synchronous to stationary coordinate transform circuit 59. The torque and flux command signals are also received by a torque current calculator 76 which provides its output $i^{e*}_{qsl}$ to the coordinate transformation circuit 59.

The inverter drive system 38 is a means for providing power for driving the motor 31 at the desired fundamental drive frequency, which may vary from low frequencies to running frequencies (which are typically in the range of 60 Hz but may also extend up to 180 Hz or 240 Hz). In addition, a signal power component is provided by the inverter system 38 to the stator windings of the motor 31 which is at a sufficiently high frequency and low amplitude as not to affect substantially the mechanical performance of the motor. The motor 31 is adapted to respond to the higher frequency voltage signals on the lines 34, 35 and 36 by yielding stator current components at the signal frequency which are modulated over time as a function of the rotor position.

Figure 4A:
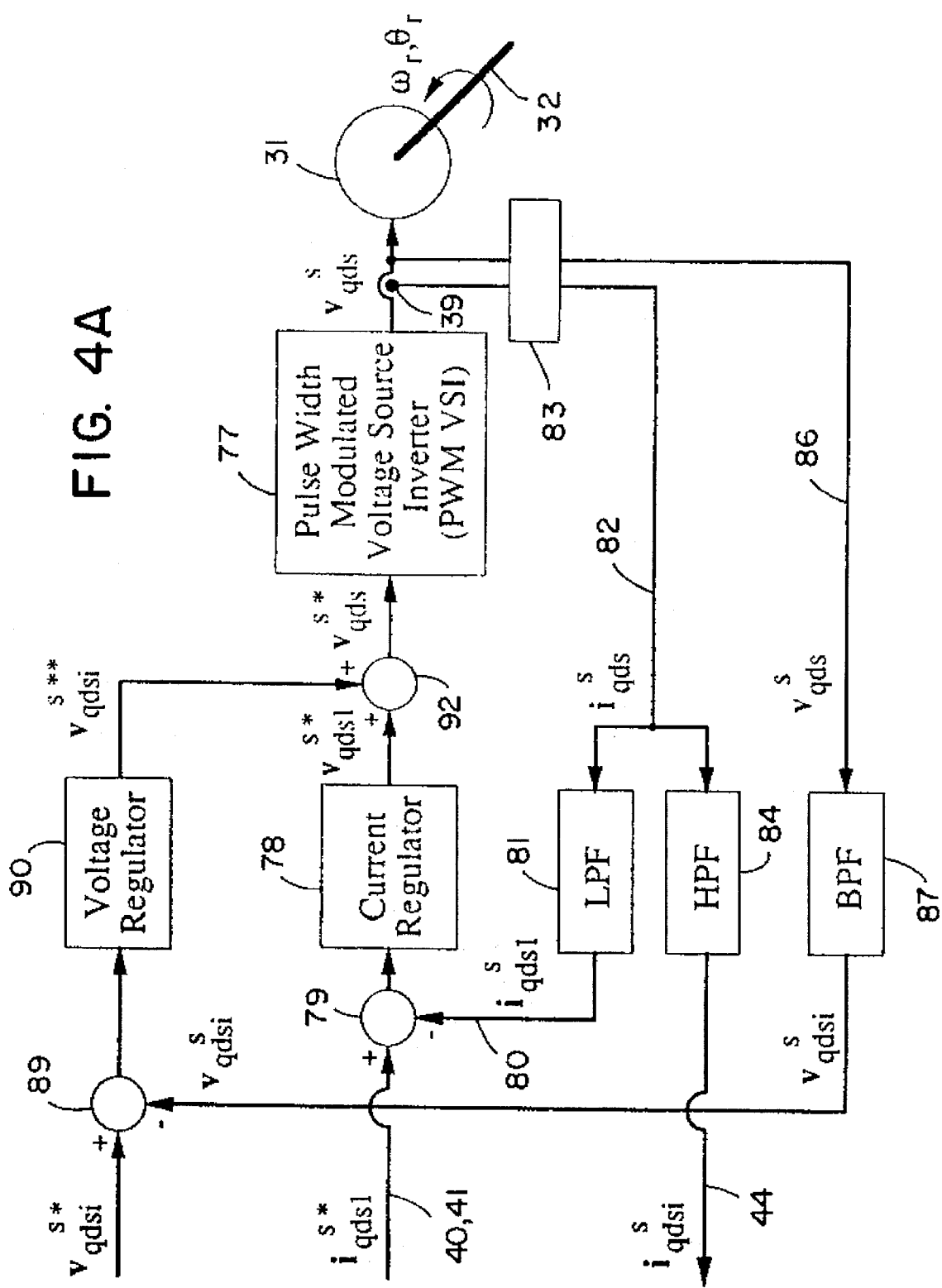
FIG. 4A is a schematic diagram of an inverter system which may be utilized in the invention which has a pulse-width-modulated voltage source inverter to provide the low frequency drive and high frequency signal components.

The introduction of the high frequency signal in the inverter system 38 can be accomplished and controlled in various ways. One manner is illustrated in FIG. 4A, in which the inverter system 38 includes a pulse width modulated voltage source inverter 77, the input to which is the sum of the output of a current regulator 78 and the high frequency voltage signal $V^{s**}_{qdsi}$. The current input signals $i^{s*}_{qdsl}$ on the lines 40 and 41 are provided to a summing junction 79 which provides the difference between the desired fundamental current $i^{s*}_{qdsl}$ and the measured fundamental drive frequency current $i^s_{qdsl}$ (provided on a line 80 as received from a low pass filter 81 which may be part of the circuit 46). The low pass filter 81 receives the current feedback signal $i^s_{qds}$ on lines 82 from a coordinate transform circuit 83 which is connected to the current sensors 39 on the stator windings. The signal on the line 82 is also passed through a high pass filter 84 to provide the high frequency components $i^s_{qdsi}$ on the output line 44, which corresponds to the portion of the current measured at the stator windings which is at the higher signal frequency. Although a low pass filter 81 and a high pass filter 84 are shown in FIG. 4A to illustrate the principles of the invention, these filters may be eliminated, or more elaborate filtering and detection techniques for the signal frequency component of the stator current may be used to provide indications of the variation of the amplitude of the high frequency signal component as a function of rotor position with greater reliability and lower noise, if desired.

In the system of FIG. 4A, signals representing the quadrature output voltages $V^s_{qds}$ are also provided from the transform circuit 83 on lines 86 to a band-pass filter 87. The filtered signals $V^s_{qdsi}$ are subtracted at a summing junction 89 from a commanded signal $V^{s*}_{qdsi}$ (e.g., a desired constant amplitude, balanced polyphase signal). The difference is provided to a signal voltage amplitude regulator 90 which provides its output to a summing junction 92 where it is summed with the output of the current regulator 78 to provide the voltage signal $V^{s*}_{qds}$ to the voltage source inverter 77.

The high frequency signal injection scheme of FIG. 4A, utilizing an optional regulator acting on an error between the commanded and measured signal voltages, minimizes fluctuations and unbalances caused by deadtime effects, dc bus voltage variations, etc. This regulation scheme effectively attempts to compensate for deviations in the PWM voltage source inverter from an ideal polyphase signal voltage source. A proportional-integral (PI) regulator acting in a reference frame synchronous to the signal frequency is a preferred means of implementing the signal voltage regulator. It is noted that all voltages and currents illustrated in FIG. 4A consist of two quantities corresponding to the d and q axes in the stationary frame. It is also noted that components such as the low pass filter 81, high pass filter 84 and bandpass filter 87 may form part of the unit 46, and the feedback components may form part of the observer 43.

Figure 4B:
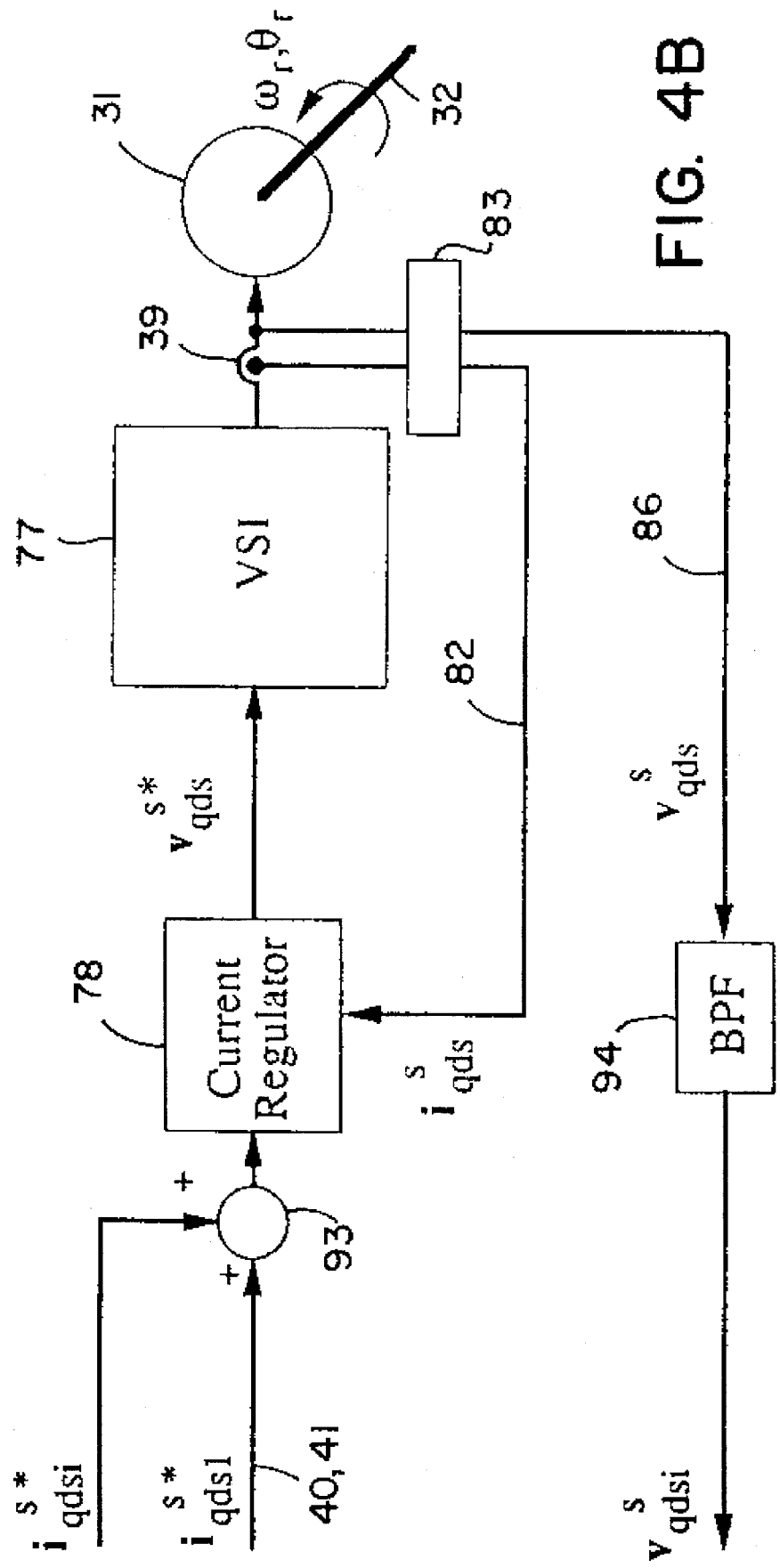
FIG. 4B is a simplified schematic diagram of an inverter system similar to that of FIG. 4A but with current injection utilizing a current regulated voltage source inverter.

Signal current injection utilizing a current-regulated voltage source inverter (VSI) to generate both the high-power main excitation and the low-power high-frequency signal excitation in the form of balanced polyphase currents is shown in FIG. 4B. The signal frequency current command signal $i^{s*}_{qdsi}$ is summed at a junction 93 with the fundamental current signal $i^{s*}_{qds1}$. The measured signal voltages $V^s_{qdsi}$ (rather than currents) are heterodyned and drive the observer to obtain position and velocity estimates. A bandpass filter 94 can be used to isolate the signal voltage components $V^s_{qdsi}$ from the fundamental excitation and inverter switching harmonics. The controllers discussed below with respect to FIGS. 5–7 can be utilized with the system of FIG. 4B by substituting $V^s_{qsi}$ and $V^s_{dsi}$ for $i^s_{qsi}$ and $i^s_{dsi}$, respectively.

A preferred heterodyne demodulation technique can be utilized to extract the rotor position information from the stator currents (or voltages, as discussed below) with high reliability and low noise. In the system of the present invention, multiplication of the q-axis and d-axis currents $i_{qsi}^s$ and $i_{dsi}^s$ from the coordinate transform circuit 46 by quadrature sinusoidal functions of estimated rotor position and signal frequency, e.g., $\cos(2\hat{\theta}_r - \omega_i t)$ and $\sin(2\hat{\theta}_r - \omega_i t)$, respectively (where $\hat{\theta}_r$ is the estimated rotor position in electrical radians and $\omega_i$ is the commanded signal frequency), results in a mixed signal $\epsilon$ given in Equation 1 below. The first term in Equation 1 is at frequency 2 $(\omega_i - \hat{\omega}_r)$ (assuming $\hat{\theta}_r = \hat{\omega}_r t$) and contains no useful position information. The second term, however, contains the desirable position information and approaches dc as $\hat{\theta}_r \rightarrow \theta_r$.

$$\epsilon = i^s_{qsi}\cos(2\hat{\theta}_r - \omega_i t) - i^s_{dsi}\sin(2\hat{\theta}_r - \omega_i t) \quad (1)$$
$$= I_{i0}\sin[2(\omega_i t - \hat{\theta}_r)] + I_{i1}\sin[2(\theta_r - \hat{\theta}_r)]$$

Because $\hat{\omega}_r \ll \omega_i$ for normal rotor velocities and injected signal frequencies, the first term can be easily removed via low pass filtering. The remaining heterodyned and filtered signal is essentially in the form of a linear position error $\epsilon_f$, i.e., $$\epsilon_f = I_{i1}\sin[2(\theta_r - \hat{\theta}_r)] \approx 2I_{i1}(\theta_r - \hat{\theta}_r) \text{ as } \hat{\theta}_r \rightarrow \theta_r \quad (2)$$

Figure 5:
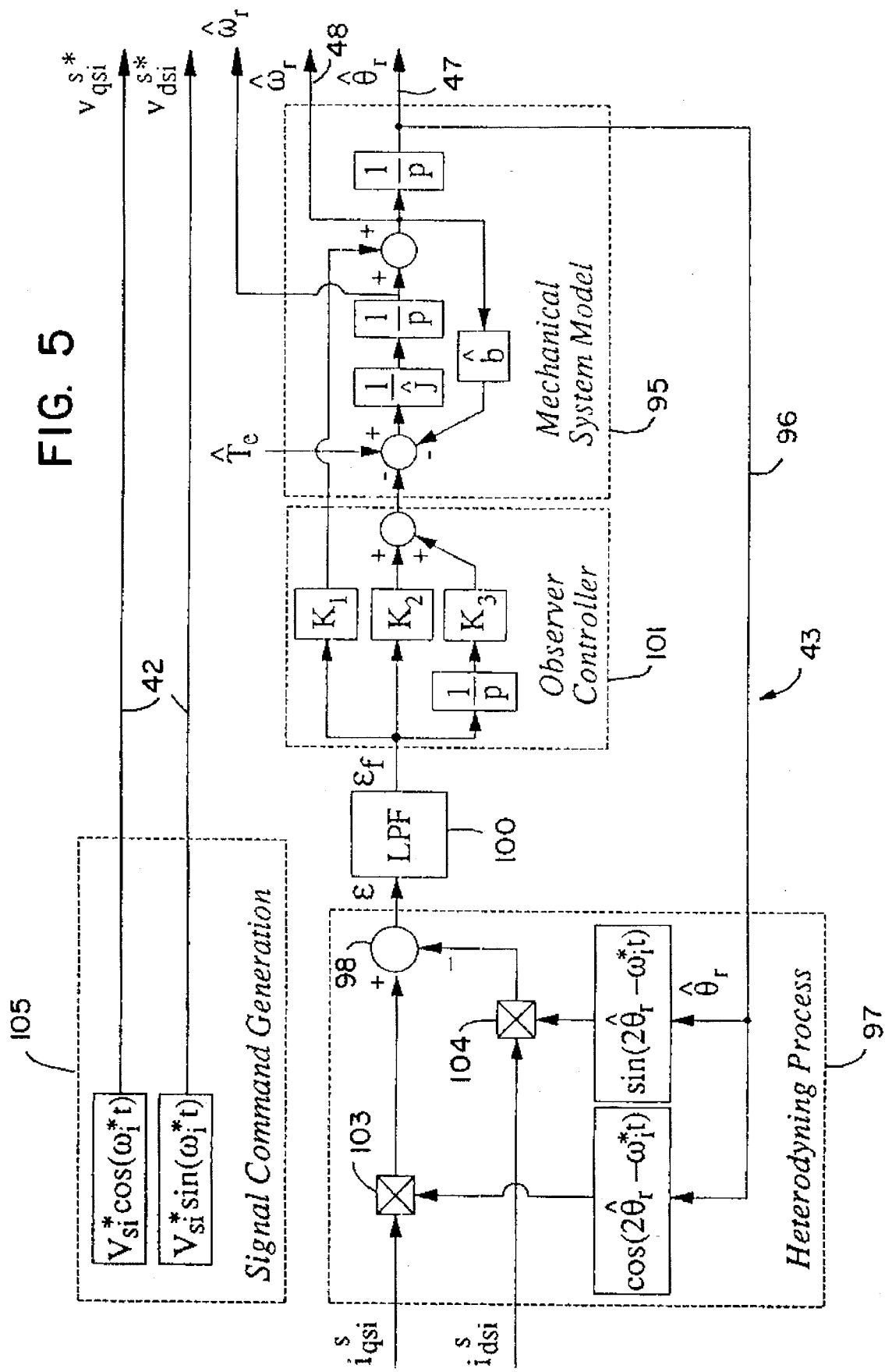
FIG. 5 is a schematic diagram of a closed loop position and velocity observer in accordance with the invention.

The position error signal $\epsilon_f$ can be used as a corrective error input to a Luenberger style position/velocity observer, as shown in FIG. 5 which is a block diagram of an implementation of the position and velocity observer 43. The position estimate $\hat{\theta}_r$ is provided from a model 95 (optional) for the motor-load mechanical system, and the estimate is provided on a path 96 to the heterodyne process 97 which calculates the functions $\cos(2\hat{\theta}_r - \omega_i t)$ and $\sin(2\hat{\theta}_r - \omega_i t)$, multiplies these functions times the current signals $i^s_{qsi}$ and $i_{dsi}$, respectively, and performs the subtraction to obtain Equation 1 at a junction 98. The signal $\epsilon$ from the output of the junction 98 is passed through a low pass filter 100 (e.g., having a cut-off frequency substantially below twice the injected signal frequency $\omega_i$ but above the maximum anticipated rotor speed $\omega_r$). The output signal from the low pass filter 100, $\epsilon_f$, is passed to a linear observer controller 101 which provides output signals to the mechanical system model 95.

The linear controller 101, consisting of gains $K_1$, $K_2$, and $K_3$ (with signal integration), forces convergence of the estimated rotor position $\hat{\theta}_r$ on the actual position, i.e., $\hat{\theta}_r \rightarrow \theta_r$. Both estimated rotor position and estimated velocity $\hat{\omega}_r$ are obtained from the observer in conjunction with the mechanical system model 95, which is a simple model of the motor-load dynamics. To improve the observer estimation dynamics, an estimate of the electromagnetic torque, $\hat{T}_c$, developed by the motor (or, optionally, for simplicity, the commanded torque $T^*_c$) is used as feedforward to drive the estimated mechanical system model 95 (which consists of at least an estimated moment of inertia $\hat{J}$ and an estimated damping $\hat{b}$, and wherein $$\frac{1}{p}$$

represents integration).

Although the use of the mechanical system model, the command feedforward, and all of the $K_1$, $K_2$ and $K_3$ gains are not required features of the controller, their use improves the estimation dynamics. The low pass filter 100 may also not be required in appropriate cases because the observer controller will also act as a low pass filter. Alternative controllers are known and may also be used.

An important feature of the observer implementation of FIG. 5 is that the accuracy of the position and velocity estimates is independent of the inductance magnitudes to a first approximation. As seen from Equation 2, the coefficient $I_{i1}$, which contains the inductance terms, acts as a gain in the closed-loop observer. It does not affect the value to which the observer converges. It is also noted that a zero sequence component in the voltage or current, and thus a machine neutral connection, is not required.

Figure 6:
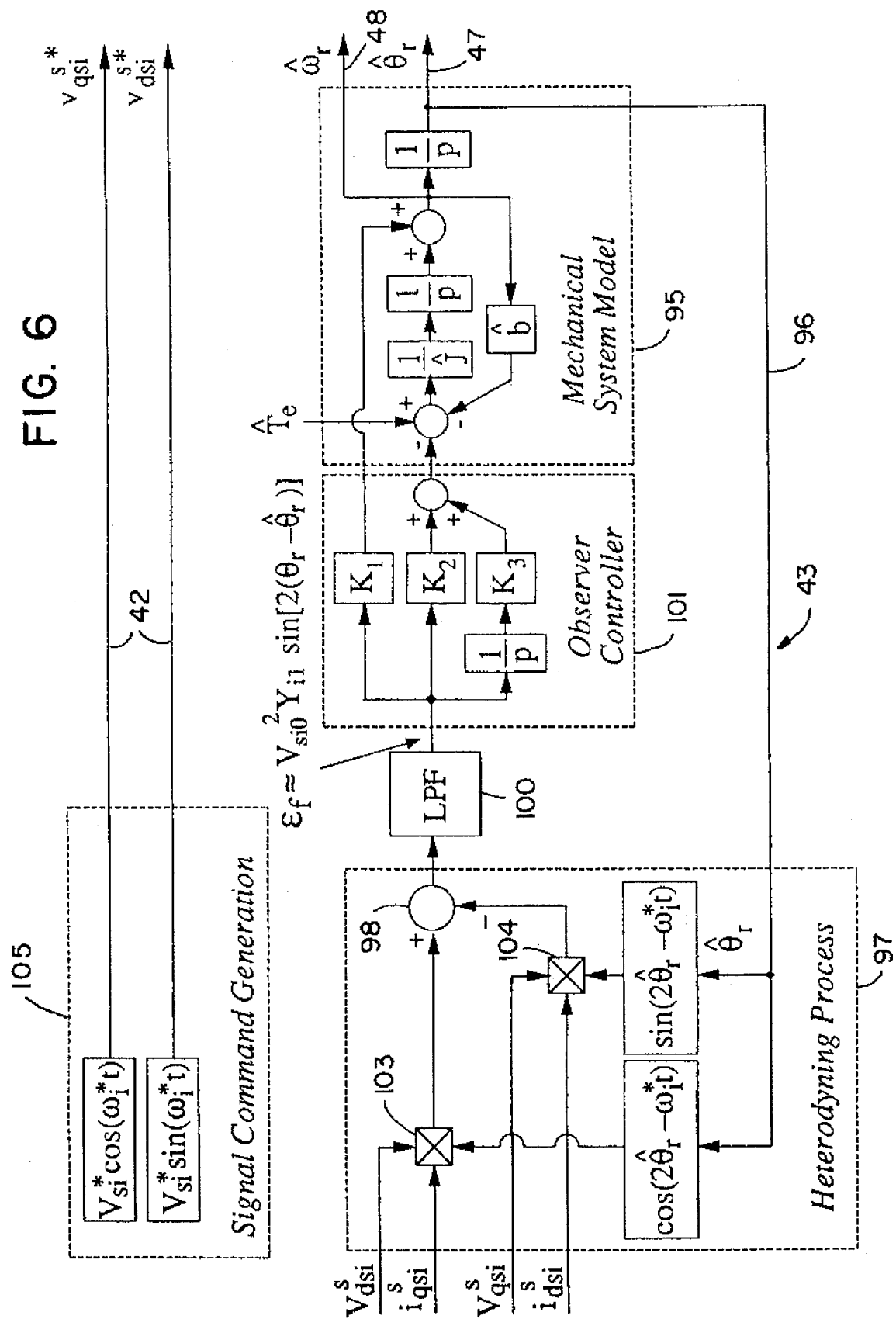
FIG. 6 is a schematic diagram of a closed loop position and velocity observer in accordance with the invention which has reduced sensitivity to unbalanced voltage sources.

The heterodyning process illustrated in FIG. 5 can be modified as discussed above to reduce the sensitivity to signal voltage unbalances and fluctuations. If the signal voltages are simply unbalanced such that $V^s_{qsi} \neq V^s_{dsi}$, inclusion of the measured signal voltage amplitudes in the heterodyning process can reduce the estimation errors attributable to the unbalance. The modified heterodyning process depicted in FIG. 6 is of the form $$\epsilon = i^s_{qsi} V_{dsi} \cos(2\hat{\theta}_r - \omega_i t) - i^s_{dsi} V_{qsi} \sin(2\hat{\theta}_r - \omega_i t) \quad (3)$$

Figure 7:
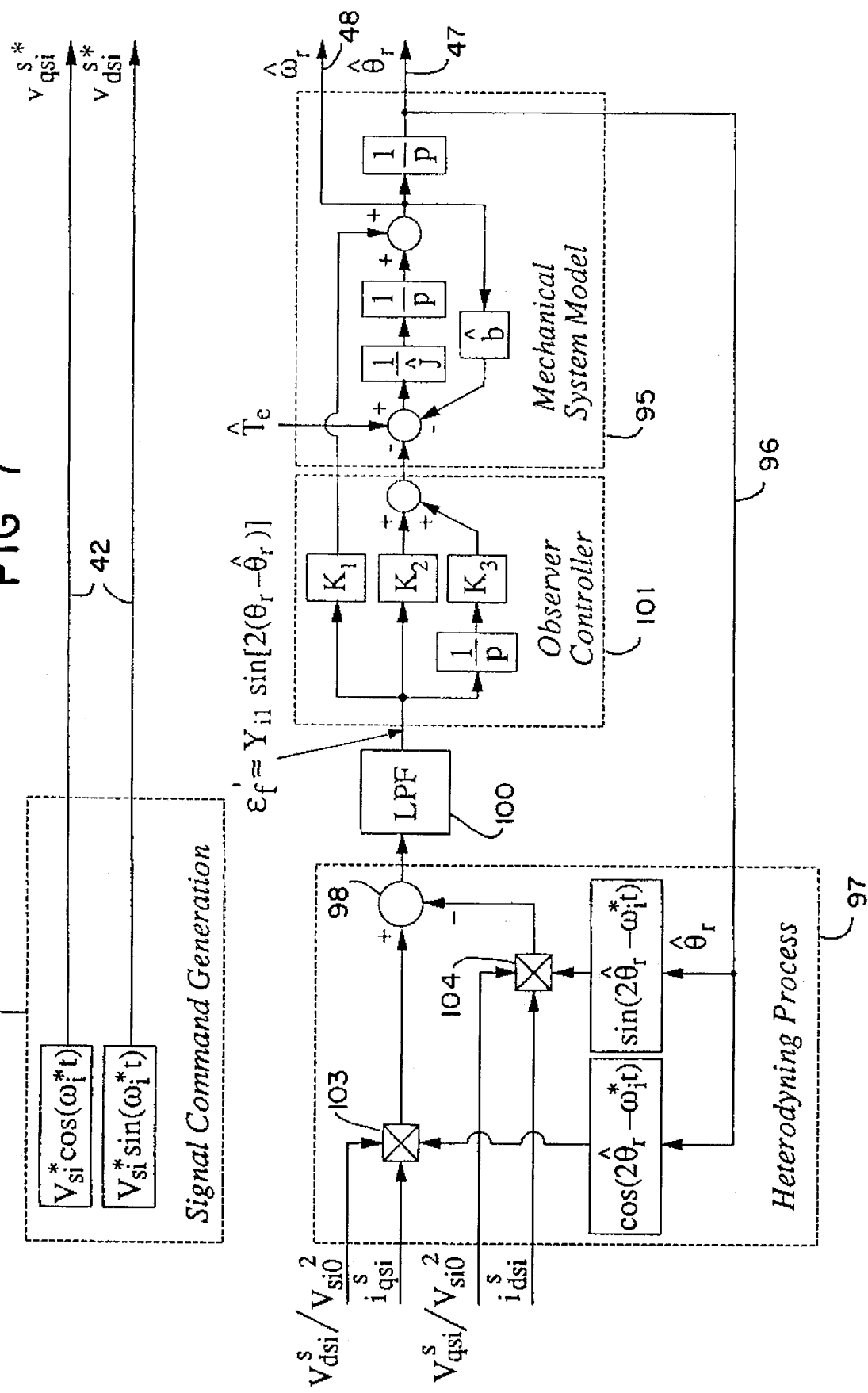
FIG. 7 is a schematic diagram of a closed loop position and velocity observer in accordance with the invention which has reduced sensitivity to both unbalanced and weak high frequency voltage sources.

Some sensitivity to voltage fluctuations can also be reduced by normalizing the heterodyned signal with respect to the squared average of the signal amplitudes as depicted in FIG. 7, i.e.

$$\epsilon = \frac{i^s_{qsi}V^s_{dsi}}{V^{s2}_{sio}}\cos(\hat{s\theta}_r - \omega_i t) - \frac{i^s_{dsi}V^s_{qsi}}{V^{s2}_{sio}}\sin(2\hat{\theta}_r - \omega_i t) \quad (4)$$

where $$V^s_{sio} = \frac{V^s_{qsi} + V^s_{dsi}}{2}$$

The heterodyning process can also be performed in two steps involving sin/cos($2\hat{\theta}_r$) and sin/cos($\omega_i t$), since $$\sin(2\hat{\theta}_r - \omega_i t) = \sin(2\hat{\theta}_r)\cos(\omega_i t) - \cos(2\hat{\theta}_r)\sin(\omega_i t) \quad (5)$$

$$\cos(2\hat{\theta}_r - \omega_i t) = \cos(2\hat{\theta}_r)\cos(\omega_i t) + \sin(2\hat{\theta}_r)\sin(\omega_i t) \quad (6)$$

In general, in addition to the signal frequency components, the stator currents will also contain components at the fundamental drive frequency $i^s_{qs1}$ and harmonics of the power electronic switching frequency $i^s_{qsh}$ (for a PWM inverter); i.e., $$\begin{aligned} i^s_{qs} &= i^s_{qsi} + i^s_{qs1} + i^s_{qsh} \\ &= I_{i0}\sin\omega_i t + I_{i1}\sin(2\theta_r - \omega_i t) + \\ &\quad I_{s0}\sin\omega_e t + I_{s1}\sin(2\theta_r - \omega_e t) + I_{h1}\sin\omega_h t \end{aligned} \quad (7)$$

and, for the d-axis, $$\begin{aligned} i^s_{ds} &= i^s_{dsi} + i^s_{ds1} + i^s_{dsh} \\ &= I_{i0}\cos\omega_i t + I_{i1}\cos(2\theta_r - \omega_e t) + I_{s0}\cos\omega_e t + \\ &\quad I_{s1}\cos(2\theta_r - \omega_e t) + I_{h2}\sin(\omega_h t + \Phi) \end{aligned} \quad (8)$$

where $\omega_c$ is the fundamental excitation frequency and $\omega_h$ represents the various harmonic frequencies.

Heterodyning all of these components as in Equation (1) results in:

$$\epsilon = i^s_{qs}\cos(2\hat{\theta}_r - \omega_i t) - i^s_{ds}\sin(2\hat{\theta}_r - \omega_i t) = I_{i0}\sin[2(\omega_i t - \hat{\theta}_r)] + \quad (9)$$

$$I_{i1}\sin[2(\theta_r - \hat{\theta}_r)] + I_s\cos[(\omega_e - \omega_i)t + 2\hat{\theta}_r] +$$

$$\frac{I_{h1}}{2}\{\sin[(\omega_h - \omega_i)t + 2\hat{\theta}_r] + \sin[(\omega_h + \omega_i)t - 2\hat{\theta}_r]\} -$$

$$\frac{I_{h2}}{2}\{\cos[(\omega_h + \omega_i)t - 2\hat{\theta}_r + \Phi] - \cos[(\omega_h - \omega_i)t + 2\hat{\theta}_r + \Phi]\}$$

Provided that $\omega_i \gg \omega_c$ and that $\omega_i \ll \omega_h$, the desired position variant term $I_{i1}\sin[2(\theta_r - \hat{\theta}_r)]$ can still be easily extracted via appropriate filtering. Thus, the additional stator current components can be removed by filtering either prior to or after heterodyning. Because the fundamental component will, in general, be much larger than the signal component, filtering prior to heterodyning is preferred to allow signal amplification to desired levels.

FIG. 6 shows a position and velocity observer similar to that of FIG. 5 but modified to have reduced sensitivity to unbalanced voltage sources. The envelope $V^s_{dsi}$ of the signal frequency voltage $V^s_{dsi}$ is multiplied times $i^s_{qsl}$ at the multiplier 103, and the envelope $V^s_{qsl}$ of the signal frequency voltage $V^s_{qsl}$ is multiplied times $i^s_{dsi}$ at the multiplier 104, to form the signals which are added together at the summing junction 98. Thus, if one of the quadiature signal voltage amplitudes becomes larger than the other, this multiplication process will help compensate the magnitudes of the current response signals. FIG. 7 shows a similar system which also helps compensate for weak high frequency voltage sources by dividing each of the envelope voltages $V^s_{dsi}$ and $V^s_{qsl}$ by the average amplitude $V_{siO}$ of the measured signal frequency voltages.

In the position and velocity observers of FIGS. 5, 6 and 7, a closed loop system is required for the specific heterodyning chosen, although the mechanical system model can be completely eliminated.

As an alternative, the stator currents may be heterodyned with simply cos/sin$\omega_i t$, yielding $$\begin{aligned} \epsilon &= i^s_{qsi}\cos\omega_i t + i^s_{dsi}\sin\omega_i t \\ &= I_{i0}\sin(2\omega_i t) + I_{i1}\sin(2\theta_r) \end{aligned} \quad (10)$$

After low pass filtering $$\epsilon_f = I_{i1}\sin(2\theta_r) \quad (11)$$

If $I_{i1}$ were known or accurately estimated then $$\hat{\theta}_r = \arcsin\left(\frac{\epsilon_f}{\hat{I}_{i1}}\right)$$

A lookup table (e.g., in EPROM) could be used to determine the arcsin. The major drawback of this approach is that the accuracy of the position estimate is directly dependent upon the accuracy of $\hat{I}_{i1}$. However, in lower performance drives, the accuracy may be sufficient.

As another alternative, the squared magnitude of the signal current magnitude can be used yielding $$\epsilon = i_{qsi}^{s2} + i_{qsi}^{s2} = I_{i0}^2 + I_{i1}^2 + 2I_{i0}I_{i1}\cos(2\theta_r - 2\omega_i t) \quad (12)$$

After high pass filter $$\epsilon_f = 2I_{i0}I_{i1}\cos(2\theta_r - 2\omega_i t) \quad (13)$$

A phase detector/comparator can then be used to obtain the phase shift relative to the known signal $\cos 2\omega_i t$, and thus obtain the rotor position. Timing of the respective zero crossings is one method of phase detection. One major drawback of such an approach is the high sensitivity of the zero crossing to noise and harmonics in the signals.

Figure 8A:
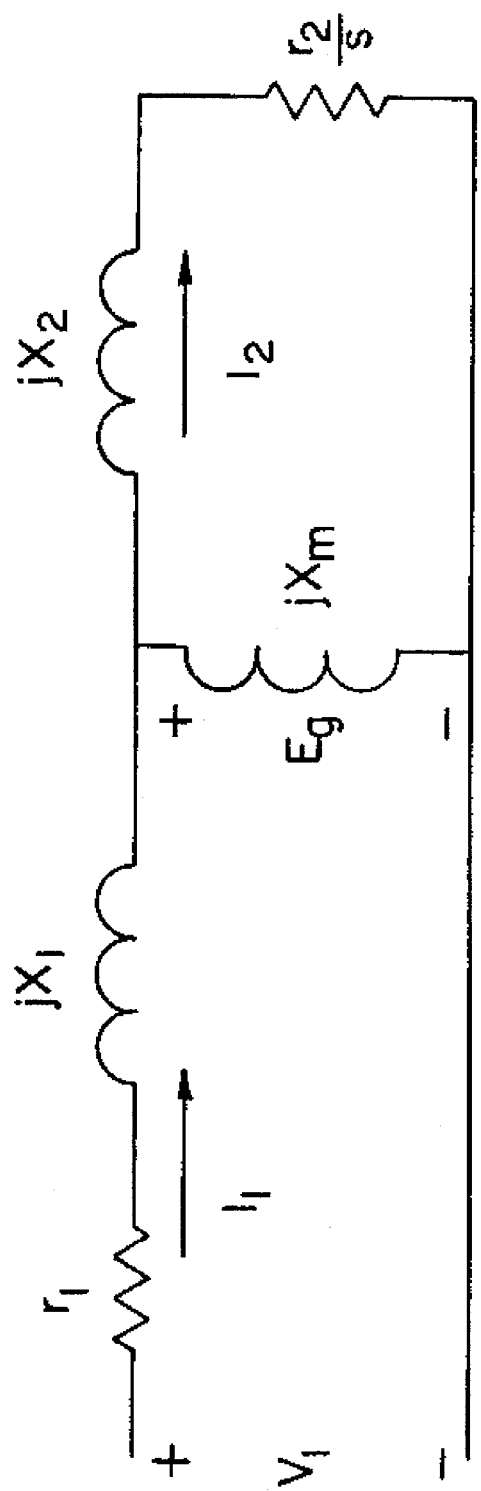
FIG. 8A is an equivalent circuit schematic diagram for a conventional induction machine in the steady state.

The present invention may be applied to obtain position and velocity information for induction machines which are appropriately adapted. The optimal injected signal frequency with respect to the electromagnetic properties of an induction machine is governed primarily by skin effects in the rotor cage (conductors) and in the laminations. The conventional steady state equivalent circuit of the induction machine is shown in FIG. 8A. Under normal operating conditions, the rotor slip (s) relative to the fundamental excitation is very small. The voltage across the resistance $r_2/s$ then dominates the air gap voltage, $E_g$. The physical implications are that the majority of the magnetic flux crossing the air gap (and producing voltage $E_g$) also penetrates the rotor core and links the rotor electrical circuit, producing useful work. Only a small fraction is confined to the rotor surface in the form of rotor leakage flux (producing voltage $jI_2X_2$).

Figure 8B:
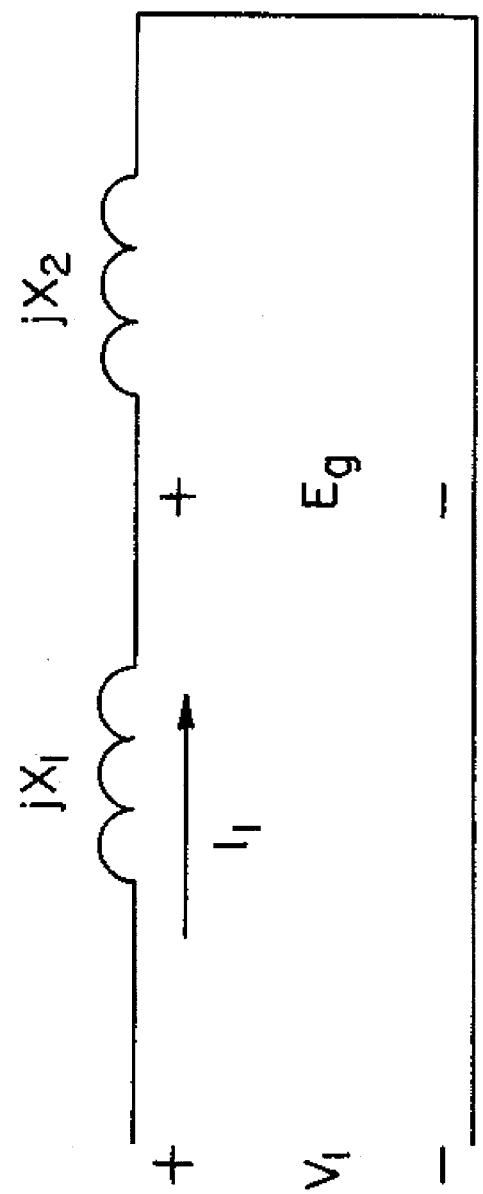
FIG. 8B is the effective equivalent circuit of FIG. 8A as seen by the high frequency excitation signal.

For high-frequency excitations (>>60 Hz) under the same normal operating speeds, the rotor slip is effectively unity (i.e., high slip frequencies) and the induction machine is predominantly reactive. The stator current is then governed by the stator and rotor leakage reactances and the approximate equivalent circuit in FIG. 8B is appropriate. Unlike the flux due to the fundamental, very little flux at high frequencies exists in the rotor core. Instead, nearly all high frequency air gap flux is confined to the rotor surface as rotor leakage flux and thus the air gap voltage $E_g$ and rotor leakage voltage $jI_2X_2$ are nearly the same.

At low slip frequencies corresponding to the fundamental drive excitation, the mutual flux is dominant, as illustrated in FIG. 9A (which shows separate mutual and leakage flux paths in the rotor) and in FIG. 9B (which shows the resulting flux paths when the leakage and mutual flux are combined). In general, for higher frequency components (i.e., high slip frequencies), the skin effects tend to reduce the stator and rotor leakage inductances and to redistribute the leakage flux. Conductor skin effect at higher frequencies forces the rotor current and thus rotor leakage flux to the top of the rotor bars (to the tooth tops for flux) as illustrated in FIG. 10A (showing mutual and leakage flux paths) and in FIG. 10B (showing combined flux paths). The mutual and rotor leakage flux are nearly equal at high frequency. As a result, very little flux penetrates into the rotor core.

Lamination skin effect essentially confines the leakage flux to a skin depth layer along the stator slot walls and the tooth surfaces of the stator and rotor. The most relevant result of both effects is to reduce the ratio of rotor to stator leakage inductance. Because useful rotor position information is contained only in the rotor leakage inductance and not the stator leakage inductance, this ratio should be maximized.

Based upon these considerations, the frequency of the injected signal must be high enough for the conductor skin effect to force a major portion of the high frequency flux crossing the air gap to be rotor leakage flux, but low enough such that the rotor to stator leakage ratio is still significant. The minimum signal frequency should be greater than the highest fundamental drive frequency will be encountered when utilizing the invention plus an additional amount corresponding to the slip frequency to produce sufficient conductor skin effects. Skin effects generally become significant only when the skin depth becomes less than the thickness of the medium.

Depending upon the precise rotor slot/bar shape, rotor conductor skin effects can be significant well below slip frequencies of 100 Hz (e.g., in double cage rotors for high starting torque). Assuming a typical operating point for the core steel, skin effects in the laminations can be expected to become significant beyond 400 1.5 kHz, depending upon lamination thickness. At 10–20 kHz, the lamination skin effect should be extensive and thus might be considered as an initial upper bound on the injected signal frequency.

An additional result of skin effects is to increase the effective stator and rotor resistances. However, for common stator conductor gauges in machines less than 100 kw, skin effects in the stator windings should not be a significant problem.

The injected signal can be generated via either additional dedicated circuitry or via the power electronic inverter already producing the fundamental drive frequency power. The power electronic inverter is the preferred generator based upon cost (and, generally, reliability) considerations. Modern hard-switched power electronic inverters are approaching and even exceeding switching frequencies of 20 kHz for small to medium size drives (<50 kw). Switching frequencies of 20 kHz or greater are desirable to reduce acoustic noise and to obtain high current regulation bandwidth. Soft-switched inverters such as the resonant dc link converter can and must operate at considerably higher switching frequencies for equivalent current regulation bandwidth.

Based upon skin effect considerations, the frequencies of the harmonic voltages associated with inverter switching that are inherently impressed upon the machine terminals are generally too high to be used as the desired signal frequency. Furthermore, the switching frequency harmonics are not a balanced polyphase set as required, and tend to be load or machine operating point dependent. However, a polyphase 1 to 2 kHz signal with low harmonic distortion can easily be synthesized in addition to the fundamental excitation when using 10 kHz to 20 kHz switching, in the manner as described above and illustrated in FIG. 4. Preferably, the inverter switching frequency should be at least 5 to 10 times the signal frequency. Further, the signal frequency should be at least 5 to 10 times the highest fundamental frequency at which the drive system will be operated.

In larger drive systems (>100 kW), inverter switching frequencies of 1–2 kHz are common. If the system is to be operated up to frequencies of 60 Hz or higher, synthesis of a sufficiently high signal frequency via the inverter may not be possible. In such cases, additional dedicated circuitry may be desirable to generate the signals at frequencies sufficiently higher than the inverter switching, e.g., 5–10 kHz. Alternatively, if only torque control is ultimately required (and not positioning), then a direct field oriented controller based upon a closed-loop flux observer as shown in FIG. 1 can be implemented. Such a controller requires position information only at low fundamental frequencies (e.g., <5 Hz). Thus, signal generation would only be required at these low fundamental frequencies. A signal frequency of 50–250 Hz would thus be sufficiently high enough and still could be generated by the inverter.

The common induction machine under 100 kw contains a squirrel cage rotor body that is cast of aluminum. To facilitate casting and in some cases to maintain the mechanical integrity of the conductor cage under very high speed operation, and to reduce slot ripple effects, the rotor slots are typically completely closed by a thin "bridge". The bridges are designed to saturate under rated operating conditions. Under light loading, however, the bridges will not saturate, resulting in a substantial variation in rotor leakage inductance over the operating range of the machine. As the fundamental field rotates with respect to the rotor (at slip frequency), the bridges will repeatedly vary between saturated and unsaturated states. When viewed from the stator windings at the signal frequency an additional inductance variation will appear at twice the slip frequency. This inductance variation can affect the accuracy of the estimated rotor position. If this variation is large relative to the variation due to the desired rotor saliency, the observer may tend to track the fundamental field rather than the rotor position. To avoid this effect, the modulation in inductance due to load induced saturation should be minimized relative to the desired introduced modulation.

Figure 12:
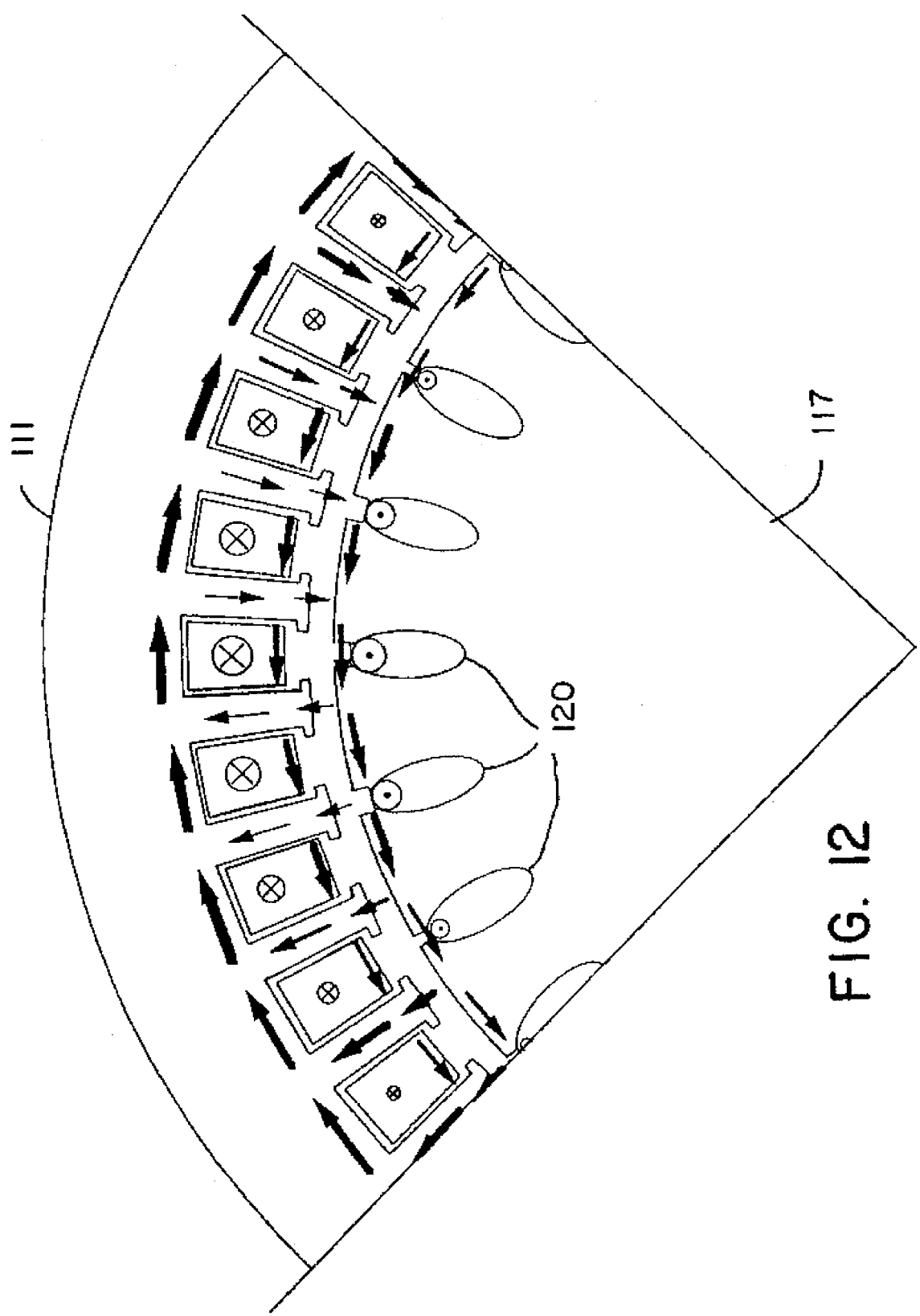
FIG. 12 is a simplified partial view through an induction machine of the type shown in FIG. 11 illustrating instantaneous flux paths for high frequency injected signal excitation over one machine pole pitch, with the rotor position relative to excitation corresponding to the low rotor leakage inductance position.

It is known that rotor slot bridge saturation can be modeled via an equivalent slot opening. Thus, one approach to minimizing the load induced saturation is to open all slots to a minimum width equivalent to the most saturated operating condition. The desired modulation may then be introduced by further opening certain slots, as illustrated by the motor shown in cross-section in FIG. 11. The motor 110 has a stator 100 with a stator core 111 on which are wound symmetrical three phase stator windings 112 between the stator teeth 114. A squirrel cage rotor 117 has a substantially cylindrical rotor body 118 mounted on a shaft 109 which mounts the rotor for rotation within the stator with conventional bearings (not shown). Symmetrical three-phase rotor windings 120, such as squirrel cage conductive bars, extend through the body at spaced positions around the periphery of the rotor. Partially open rotor slots 121 are formed over some of the conductive bars 120. The width of these minimum width slots may be selected to minimize the load induced saturation effects. Variation in the rotor leakage inductance seen by the stator windings is obtained by providing slots 122 over other conductive bars 120 which are wider than the partially open slots 121. For a four pole squirrel cage induction motor of the type shown in FIG. 11, the widest slots 122 are formed above conductive bars which are centered at 90° mechanical degrees with respect to each other around the periphery of the rotor. The rotor q-axis 125 may be considered to extend through the center of a group of conductive bars having the widest slots thereover, whereas the rotor d-axis 126, at an angle of 45° mechanical degrees to the q-axis 125, extends through the center of a group of conductive bars which have the minimum width slots thereover. As illustrated in FIG. 11 for the four pole motor, the other groups of conductive bars having maximum width slots are centered at angular positions at increments of 90° with respect to the axis 125, illustrated by the axes 128, 129 and 130. Simplified flux paths for the high frequency excitation signal over one machine pole pitch are illustrated in FIG. 12. The rotor position relative to excitation corresponds to the low rotor leakage inductance position.

Even with the use of minimum width slot openings, decoupling may be necessary in certain cases to further reduce the component due to saturation, for example, by estimating the effect of the loading component and subtracting that estimate from the error signal $\epsilon_f$ of Equation 2.

Saturation of the main flux paths (i.e., teeth and core) in both the stator and the rotor may, under certain circumstances, also create an undesirable modulation of sufficient magnitude so that decoupling should be used to reduce the modulation. Alternatively, operation at a reduced flux level will reduce the undesirable modulation due to main flux saturation.

A modulation in the rotor leakage inductance will result in an unbalanced rotor circuit, which can lead to flux and torque pulsations. However, this unbalance is generally insignificant for the low frequency rotor currents produced by the fundamental drive power under rated slip conditions because the rotor impedance is generally dominated at the fundamental drive frequency by the rotor resistance, which remains balanced. However, if needed, it is possible to eliminate any such pulsations via appropriate command feed-forward or state feedback incorporated in a field oriented controller. Furthermore, the rotor slots or teeth can be designed to create a rotor impedance that is unbalanced at the signal frequency, but balanced at the fundamental (slip) frequency.

It should again be noted that an advantage of the present invention is that the rotor leakage inductance generally has a relatively insignificant influence upon normal machine operation. Thus, the required modifications in the machine construction have only a minor effect upon machine performance.

The high frequency currents and flux associated with the power at the injected signal frequency will create additional losses in the stator and rotor windings and in the core. Thus, an induction machine adapted to provide position information may require a slight derating. With high quality detection circuitry, of low noise design, the power loss associated with the signal injection can be minimized so that little, if any, motor derating is required.

Synthesis of the polyphase signal voltage by a pulse width modulated (PWM) inverter will reduce the maximum amplitude of the fundamental component that can be generated by the same inverter. The common practices of pulse dropping, and ultimately conversion from a PWM to a 6-step switching scheme, to increase the fundamental component, will not permit the simultaneous synthesis of the signal component. Therefore, unless the DC bus voltage is raised, field weakened operation of the motor may be required at a lower speed. To minimize this voltage derating, the detection circuitry should be designed such that the signal voltage (and current) amplitudes are as small as possible.

The current regulator in a current regulated inverter will attempt to remove the high frequency signal currents which are deliberately introduced in accordance with the present invention. To avoid attenuation of these currents, the signal frequency should be selected to be either well beyond the regulator bandwidth or the measured signal component at the signal frequency should be removed by appropriate signal processing, (e.g., a notch or low pass filter) prior to feedback into the regulator.

The present invention can also be implemented by modification of many existing induction machines to provide the required spatial variation. To do so, the rotor is removed from the stator of the machine, and a simple machining process is carried out utilizing a slitting saw of desired width to open the rotor slots to achieve the desired spatial modulation of the rotor leakage inductance. The width of the slots can be cut to provide the rotor spatial variation pattern of FIG. 11, or other rotor slot patterns as described below. After the rotor slots are cut above the conductive bars to the desired width, the rotor may be reinstalled in the stator of the machine. Existing induction motors having rotors with closed rotor slots are readily modified in accordance with the present invention to provide the spatial variation in the rotor leakage inductance as seen by the stator windings.

The minimum slot width required to avoid load induced saturation is known to increase with machine size. This may be illustrated with respect to the view of FIGS. 13A and 13B which show an exemplary conductive bar with a slot about it. Neglecting fringing effects, the reluctance across the slot opening is given by the expression $$R_{sl} \approx b/(\mu_0 aL)$$

where L is the machine stack length. Assuming that the MMF drop through the lamination surrounding the rotor slot is negligible compared to the drop across the slot opening, the fundamental component (at slip frequency) slot leakage flux is:

$$\phi_{sl1} \approx B_{sl1} aL \approx i_{rb1}/R_{sl} \approx [(\mu_0 aL)/b] i_{rb1} \quad (14)$$

where $i_{rb1}$ and $B_{sl1}$ are the fundamental components of the rotor bar current and leakage flux, respectively. Thus, for a given maximum desired slot leakage flux density which avoids saturation for given maximum rotor bar current, the required slot opening width is:

$$b \approx \mu_0 (i_{rb\ max}/B_{sl\ max}) \quad (15)$$

It is noted that the required slot opening width is independent of slot dimensions (to a first approximation), and that, since current loading increases with machine size, the slot opening must also increase with machine size.

The above analysis and also experimental results suggest that the minimum slot opening width required to avoid saturation near the slot opening (at rated load) is around 6 mil (0.15 mm) for a conventional 230/460 v, 3 phase, 4 pole, 5 Hp Nema B induction motor.

Obtaining slot openings narrower than about 6 mil (0.15 mm) is difficult with conventional machining techniques. Slitting saws with cuts less than 6 mil are uncommon and require special care. Alternative techniques, for example, laser and wire cutting, may be used if desired.

The maximum slot opening width should be wide enough such that sufficient rotor leakage inductance modulation is created to allow detection, but not so large as to significantly alter (reduce) the magnetizing inductance. If the maximum slot opening width is too wide (compared to minimum width), a significant modulation in the magnetizing inductance seen by the fundamental may occur. Such a modulation may create undesirable flux and reluctance torque pulsations. To completely eliminate modulations in the magnetizing inductance, a redesign of the rotor as described below is preferred.

Figure 13A:
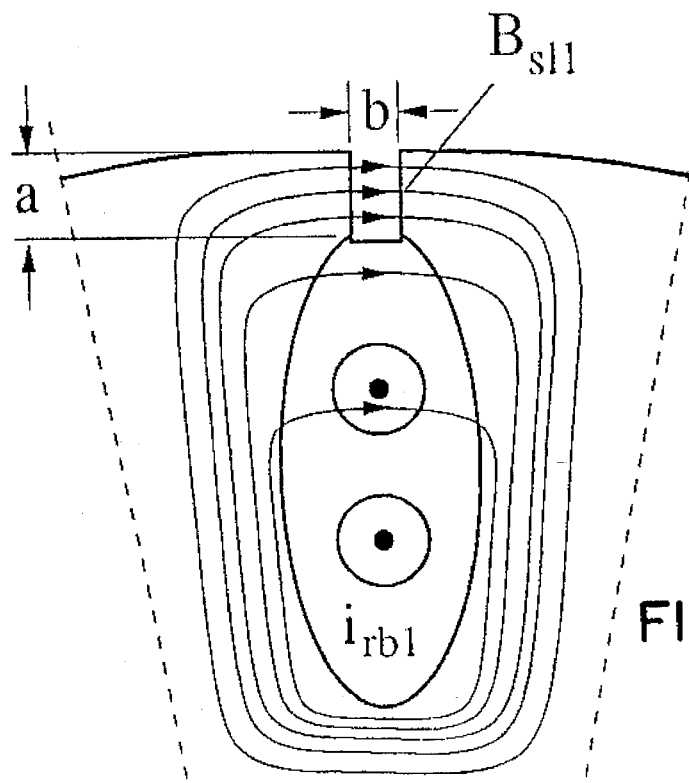
FIGS. 13A and 13B are illustrative views through a portion of an induction machine rotor illustrating rotor slot opening dimensions and the corresponding current and leakage flux components for a deep rotor slot.
Figure 13B:
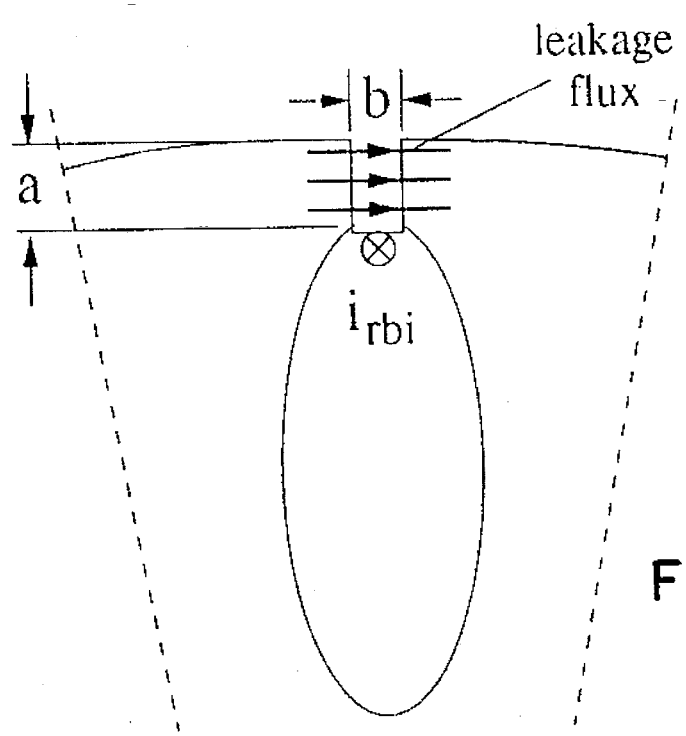

In addition to the modification of existing standard squirrel cage rotors for induction motors, rotors may be utilized which are specifically designed for appropriate spatial modulation of the leakage inductance of the rotor in accordance with the present invention. One manner of obtaining such spatial modulation is appropriate adjustment of the slot dimensions. The slot leakage inductance, $L_{slot}$, which is one component of the rotor leakage inductance, is inversely proportional to the slot reluctance. With reference to the slot width b and slot depth a as illustrated in FIGS. 13A and 13B, the slot leakage inductance is approximately given by the following expression:

$$L_{slot} \approx K_1(\mu_0 aL)/b \qquad (16)$$

where $K_1$ is a factor dependent upon the turns ratio, winding distribution, slot numbers, etc.

Figure 14:
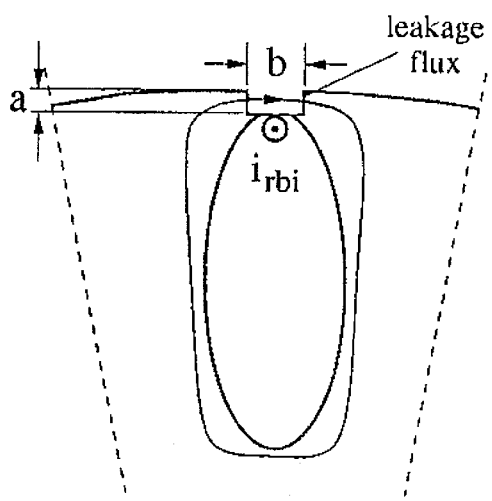
FIG. 14 is an illustrative view through a portion of an induction machine rotor illustrating the rotor current and leakage flux for a shallow depth slot.

Both the slot depth a and the width b can be changed—as illustrated in FIG. 14 which shows a wider width b and a shallower depth a—to increase the amount of spatial modulation which can be obtained as compared with adjustment of the width only. The minimum width b is determined by either die or manufacturing constraints and/or load induced saturation effects.

Figure 15:
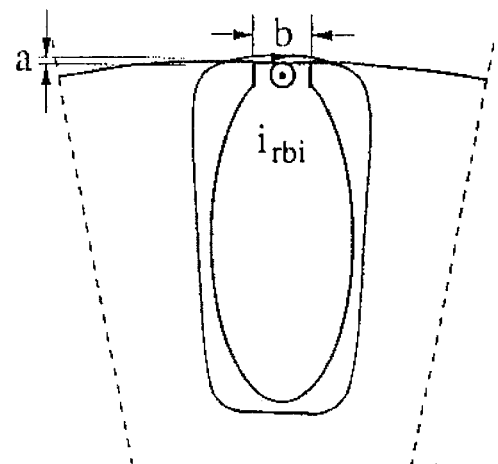
FIG. 15 is an illustrative view of a portion of an induction machine rotor similar to that of FIG. 14 but with a filled slot to provide low leakage flux.
Figure 16A:
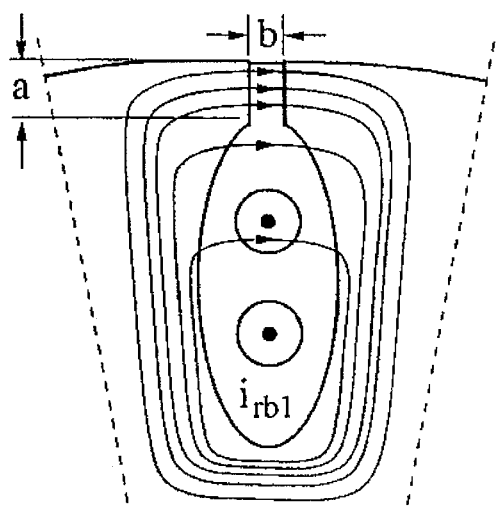
FIGS. 16A and 16B are views through a portion of an induction machine rotor illustrating the current and leakage flux at the fundamental and at the injected signal frequency, respectively, for a filled deep rotor slot.
Figure 16B:
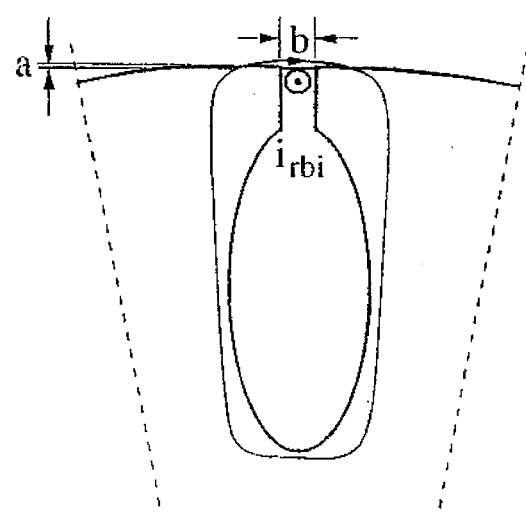

Spacers would normally be required to contain the molten aluminum within the open slots during casting of the rotor body. Alternatively, the molten aluminum may be allowed to flow and completely fill the slot opening, forcing the high frequency induced rotor currents and hence the leakage flux to the rotor surface, as illustrated in FIGS. 15 (for a wide slot) and FIGS. 16A and 16B (for a narrow slot). Thus, even with the same slot dimensions (e.g., as the slot of FIGS. 13A and 13B), the rotor slot leakage inductance seen by the high frequency component in a motor with the slots of FIGS. 16A and 16B would be changed because of a reduction in the effective slot opening depth a. However, the inductance seen by the fundamental component of the rotor currents at slip frequency would be relatively invariant due to a more uniform distribution over the entire slot, as illustrated in FIGS. 13A and 16A. Because there is only a slight increase in the conductive bar cross-section, the low frequency rotor resistance would also be relatively invariant, or can be made invariant by altering the slot areas. As a result, the fundamental drive frequency component which is responsible for torque production will see a nearly symmetrical rotor impedance and magnetizing inductance, while the high frequency signal excitation will see the appropriate modulation in the rotor impedance as a function of rotor angular position.

Although the rotor leakage generally dominates the high frequency rotor impedance, the effective high frequency rotor resistance can also be modulated by proper slot/bar design in conjunction with, or as an alternative to, leakage modulation. Consequently, in accordance with the present invention, modulation of the effective impedance at the stator windings as seen by the high frequency signal excitation is obtained by spatial modulation of the effective rotor impedance as a function of the rotational position of the rotor. Slot geometries capable of producing the desired high frequency impedance modulation are not limited to the simple oval shapes with variable openings as have been illustrated above. It will be apparent to a person of ordinary skill that there are many different rotor/slot bar geometries capable of producing the desired rotor impedance modulation.

Furthermore, a modulation in the rotor impedance may also be achieved via a modification or design alteration of the rotor end ring (end winding) region.

Some fluctuation or unbalance of the voltage source driving the motor windings can be expected even with a voltage source inverter. The amount of voltage signal fluctuation and/or unbalance is dependent upon many factors. One source of fluctuation is a variation in the DC bus voltage due to a change in the motor operating point. For example, when the motor decelerates, kinetic energy is typically absorbed by the bus capacitors, causing the bus voltage to rise. Dissipation of the energy through resistors or conversion back to the AC supply is recommended to minimize the bus fluctuations.

Inverter deadtime due to the rise and fall times of the switching devices and the intentionally introduced delay between the commutation of devices (to avoid accidental bus shoot throughs or short circuits), is another major cause of voltage signal fluctuation and unbalance. The implementation of schemes to minimize or compensate for deadtime are preferred.

As discussed, the present invention utilizes variations in the effective impedance seen by the high signal frequency at the stator windings as a function of rotor position to determine rotor position. Such impedance variation includes the effective rotor resistance as well as the rotor leakage inductance, or both. A variation in the rotor resistance can be achieved, for example, by utilizing differing bar or end ring cross-sectional area and shape or geometry.

Moreover, the effective rotor resistance will increase while the leakage inductance will decrease as the signal frequency increases. This phenomena is due to skin effects, and the quantities will vary roughly with $\sqrt{\omega_i}$. Thus, at very high signal frequencies (e.g., >>20 kHz), rotor resistance modulation can be a significant, possibly dominant, component of the net rotor impedance modulation. A rotor with the combination of the slot designs in FIG. 15 and 16b will have a modulation in both the rotor leakage inductance and the high frequency rotor resistance. The high frequency leakage inductance and resistance will be lower for the slot design in FIG. 15 than for that of FIG. 16b. Because the conductor fills the entire slot to the rotor surface, the rotor leakage inductance of both designs will be lower than the corresponding slot designs in FIG. 13b and 14. The rotor resistances should be similar, however. Thus, the rotor resistance modulation will be a more significant component of the overall impedance modulation for the designs in FIGS. 15 and 16 than for the designs in FIGS. 13b and 14.

If the effective rotor resistance is a significant component of the rotor impedance, the stator currents will be phase shifted; i.e., $$i_{qsi} = I_{i0}\sin(\omega_i t + \phi) + I_{ii}\sin(2\theta_r - \omega_i t + \phi) \qquad (17)$$

$$i_{dsi} = I_{i0}\cos(\omega_i t + \phi) + I_{ii}\cos(2\theta_r - \omega_i t + \phi) \qquad (18)$$

This phase shift, $\phi$, will permeate through the heterodyning process, yielding $$\epsilon = I_{i0}\sin(2\hat{\theta}_r - 2\omega_i t + \phi) + I_{ii}\sin(2(\theta_r - \hat{\theta}_r) + \phi) \qquad (19)$$

and, after filtering:

$$\epsilon_f = I_{ii}\sin(2(\theta_r - \hat{\theta}_r) + \phi) \qquad (20)$$

Since the observer will attempt to drive $\epsilon_f$ to zero, the phase shift will be present in the position estimate:

$$\hat{\theta}_r = \theta_r + \phi/2 \qquad (21)$$

With the exception of some temperature dependence, the phase shift is constant at a fixed signal frequency. It thus can be easily compensated for during an initial rotor position calibration.

Figure 17:
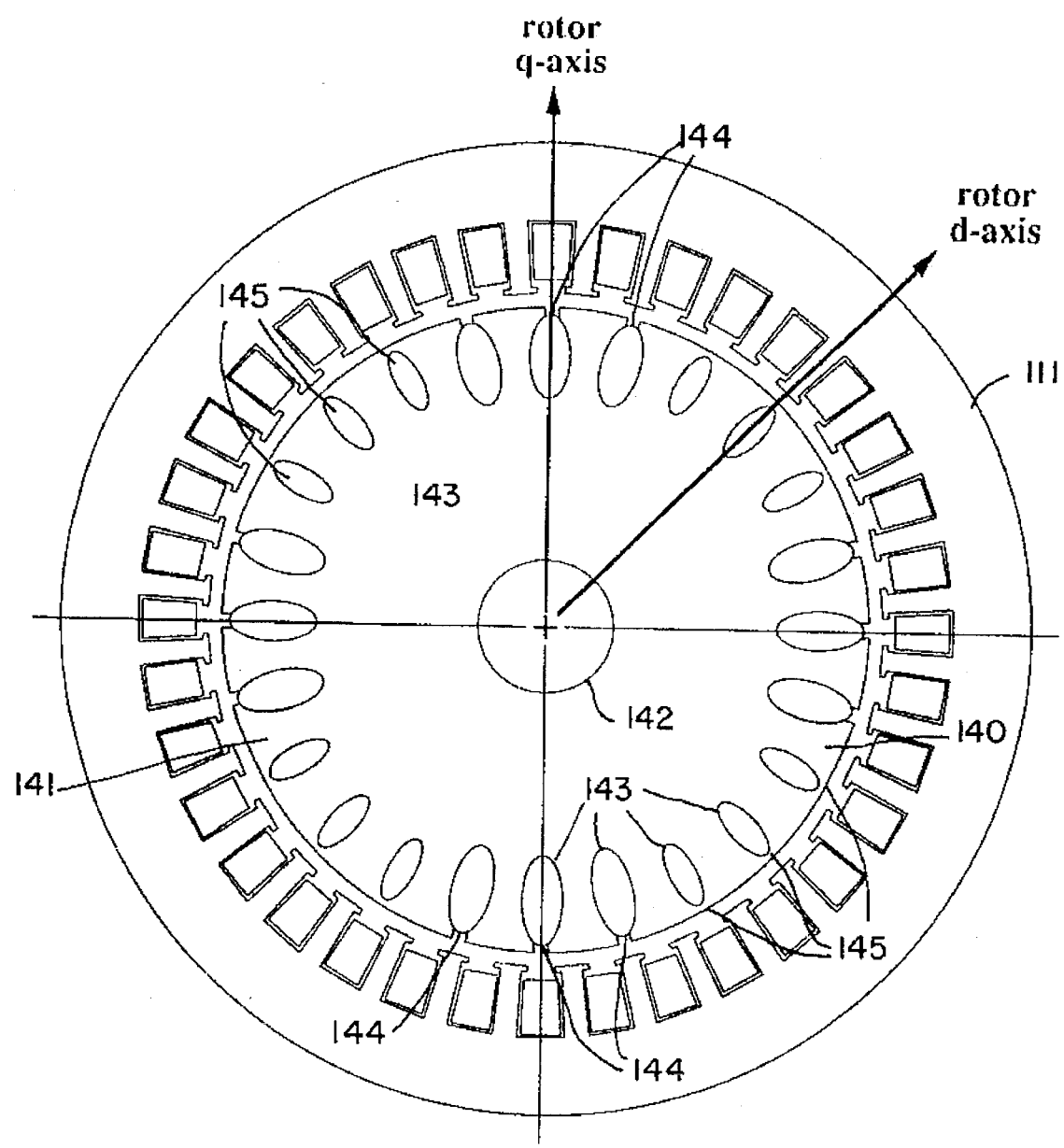
FIG. 17 is a simplified view through a four-pole squirrel cage induction motor having spatially variant rotor leakage inductance created by opening selected rotor slots while leaving other rotor slots closed.

A further embodiment of an exemplary induction motor having spatial variation in impedance with rotor position is shown in FIG. 17. The machine has a standard four pole stator and a rotor 140 having a cylindrical rotor body 141 mounted for rotation on a shaft 142. A plurality of squirrel cage conductive bars 143 extend through the rotor body 141 at spaced positions around the periphery of the rotor. Slots 144 are formed above the conductive bars 143 along one of the machine axes, e.g., the q-axis, while the conductive bars 143 which are centered on the other axis (the d-axis) have bridges 145 formed thereacross, that is, the slots over these bars are closed. The slots 144 formed over the conductive bars 143 are centered about the four orthogonal axes of the machine. It is noted that with this configuration, when under load, the bridges 145 will generally tend to saturate, in which case the incremental rotor leakage is equivalent to that of an open slot, and the inductance variation between the d and q axes is reduced. Under lighter loading, where the bridges are not saturated, a considerable variation in rotor leakage inductance will occur with change in rotational position of the rotor.

Figure 18:
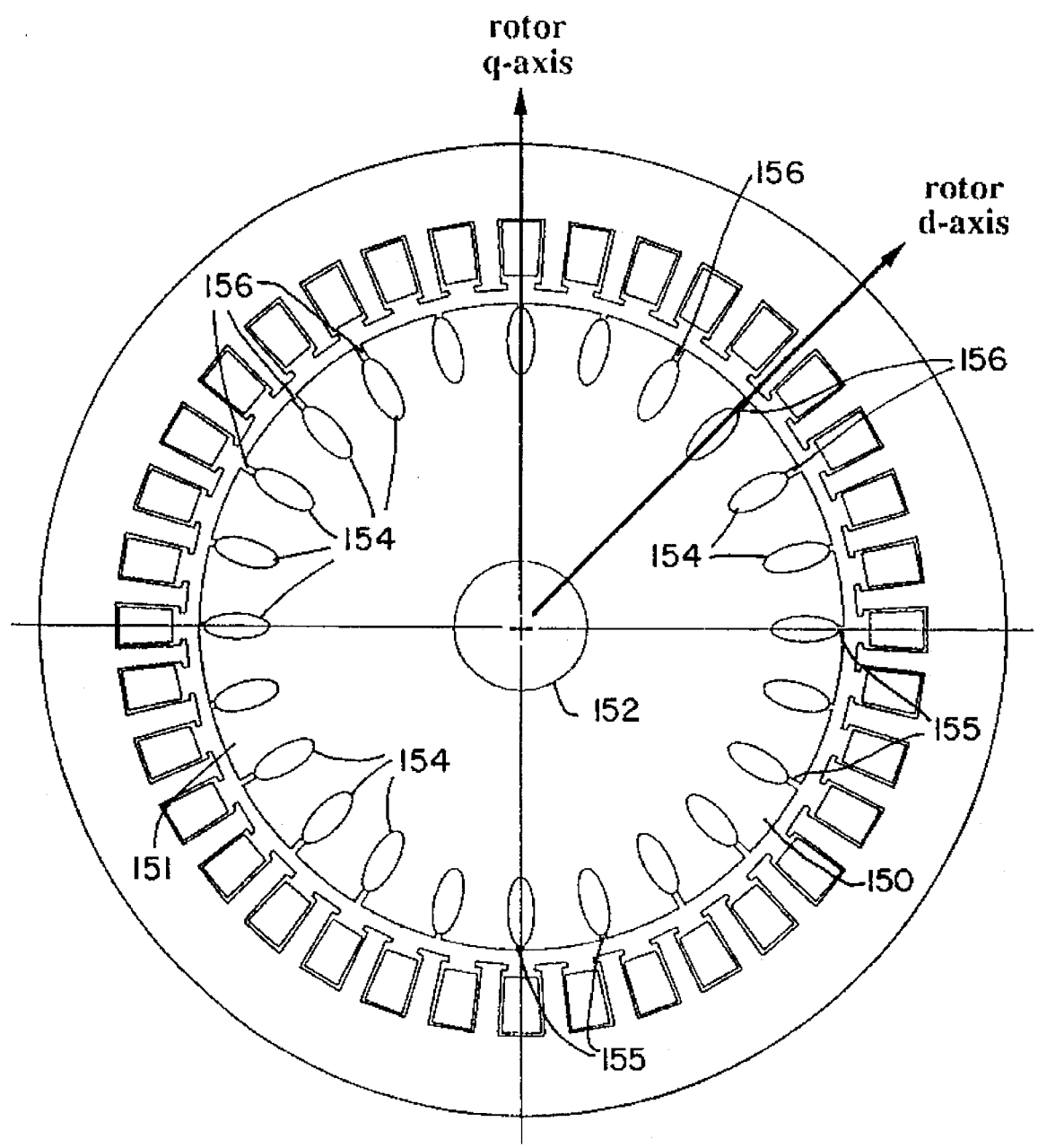
FIG. 18 is a simplified view through a four-pole squirrel cage induction motor having spatially variant rotor leakage inductance created by variation in the rotor conductor bar depth and slot depth around the periphery of the rotor.

A further alternative motor embodiment is shown in FIG. 18, in which a rotor 150, mounted for rotation within the stator 111, has a rotor body 151 mounted on a shaft 152 and a plurality of conductive bars 154 extending through the rotor body 151 at spaced positions about the periphery of the rotor. The conductive bars 154 are not, however, uniformly spaced from the surface of the rotor. Rather, the conductive bars 154 which are centered on one of the machine axes, e.g., the q-axis, are closer to the rotor surface and have relatively shallow slots 155 over them, while the conductive bars 154 which are centered on the d-axis are spaced further from the surface and have relatively deep slots 156 formed over them. The conductive bars having shallow slots 155 are centered around the four orthogonal axes of the four pole machine, while the conductive bars with the deeper slots 156 over them are positioned between the bars with shallower slots. For a four pole machine, this pattern repeats every 180 electrical degrees, or every 90 mechanical degrees. As a result, the leakage inductance at the higher signal frequency as seen at the stator windings varies as a function of the rotational position of the rotor.

Figure 19:
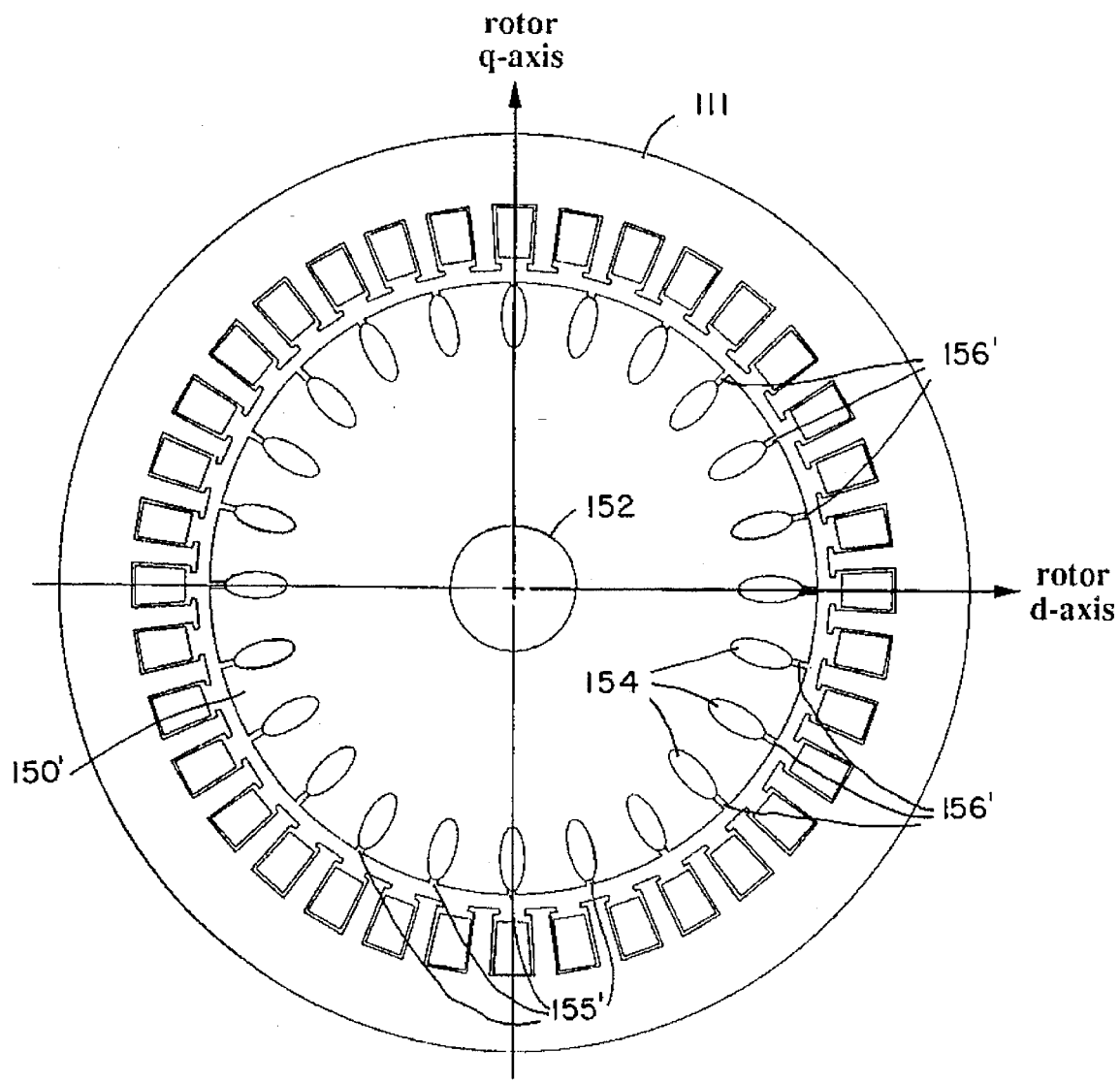
FIG. 19 is a simplified view of a two-pole squirrel-cage induction motor with spatially variant rotor leakage inductance created by variation in the rotor bar depth and slot depth.

A two pole version of the machine of FIG. 18 is shown in FIG. 19, and is similar to the machine of FIG. 18 but with the rotor slots 155' and 156' having spatial variation which repeats twice over the periphery of the rotor 150'. It is noted that for a 4 pole machine, the rotor slot width/depth modulation maxima and minima should be at 90° angles to each other (the modulation period is 90° mechanical). For 2 pole machines, the modulation period would be at 180 mechanical degrees as shown in the FIG. 19. Generalizing to all machines, the required modulation has a period equal to "1 pole pitch"; i.e. the distance spanned by 1 pole of the machine. Be definition, 1 pole pitch corresponds to 180 "electrical degrees". The electrical degrees refers to the flux and mmf waveforms; i.e. the electromagnetic fields within the machine. The rotor position/velocity estimates and actual quantities contained in the accompanying figures are thus in electrical degrees (or radians).

The demodulation method of the present invention assumes the spatial modulation in the rotor impedance is a periodic function which is preferably purely sinusoidal; i.e. sine or cosine $2\theta_r$. If the modulation contains additional harmonics (e.g. a triangular wave modulation), errors in the position/velocity estimates will be introduced unless some form of compensation or mapping is included in the demodulation. However, the stator windings in all conventional machines are designed to accentuate the fundamental spatial components and to attenuate higher spatial harmonics. Thus even with a "square wave" modulation in the slot widths or depths (e.g., slot openings vary between only two widths), the resulting rotor impedance modulation seen by the stator windings will be nearly sinusoidal, and most likely suitable for less demanding applications. This is a particularly attractive attribute of the present invention as it implies that little if any compromise in machine performance is required to obtain a spatial modulation of sufficient amplitude to track. Previous velocity estimation approaches have attempted to track the effects of individual rotor slots, such as the induced voltage or current ripple at the rotor slot frequency. But the stator and rotor windings are conventionally designed to minimize these slotting effects to minimize torque ripple (cogging torque) and associated losses. Thus the slot ripple effects are generally too small to reliably track, especially over a wide operating range. Accentuating the ripple by design modifications will compromise the machine performance. Simply stated, the stator windings are inherently designed to detect inductance variations and electromagnetic effects that occur over a machine pole pitch, but not over a single slot.

Thus, in the present invention, it is possible to utilize any periodic spatial modulation in the rotor impedance (e.g. $\sin/\cos 2\theta_r +$ harmonics, triangular waveforms, etc.) with a period of 180 electrical degrees.

Although the present invention has been described above with respect to a squirrel cage induction motor, it is understood that it may be applied to other types of AC electric machines which have magnetic saliency on the rotor.

Figure 20:
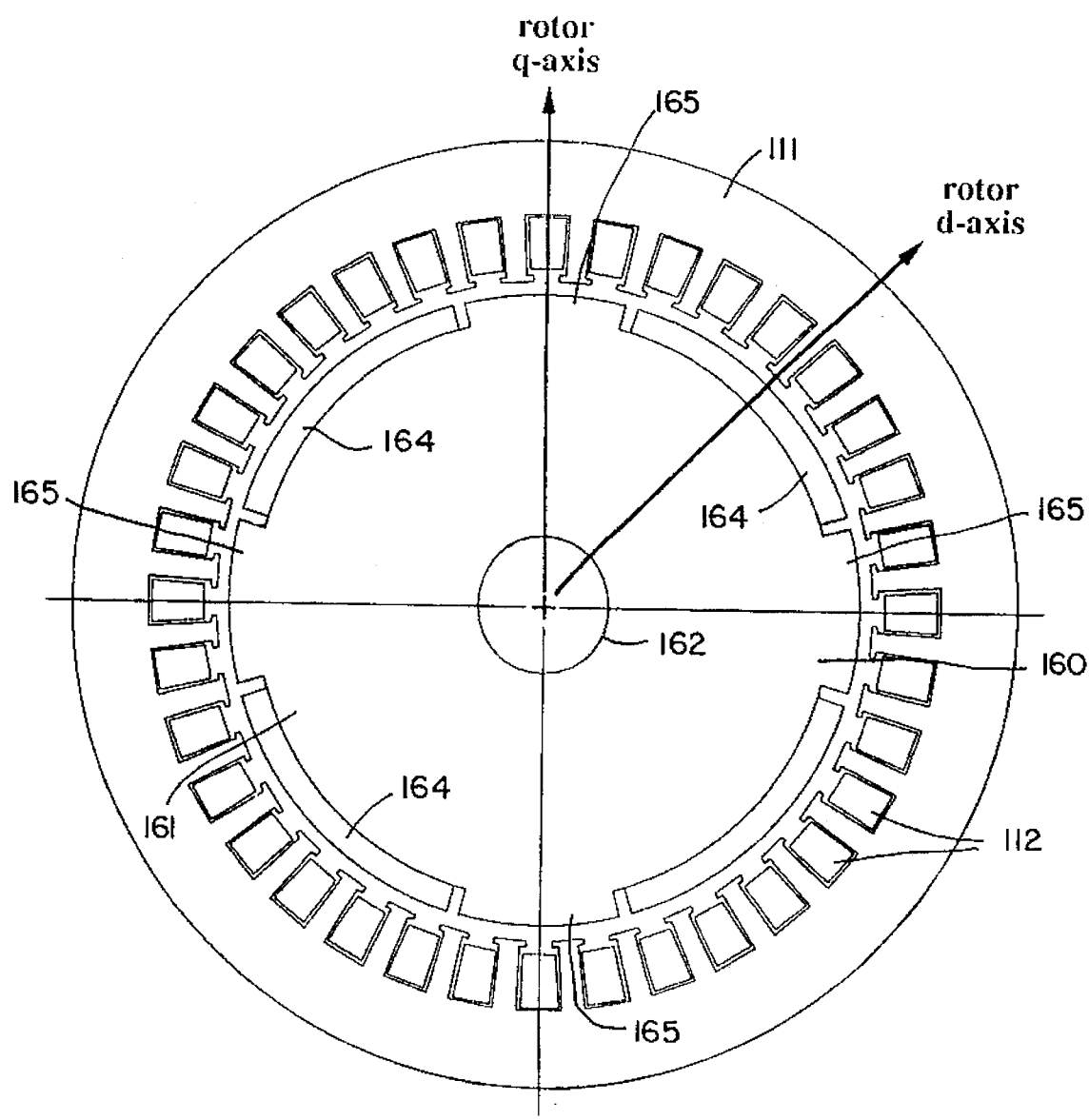
FIG. 20 is a simplified view through a four-pole inset mounted permanent magnet synchronous machine having inherent rotor magnetic saliency.

A four pole inset mounted permanent magnet synchronous machine with inherent rotor magnetic saliency is illustrated in FIG. 20. The exemplary motor has a four pole stator 111 with symmetrical three phase stator windings 112, and a rotor 160 with a rotor body 161 mounted for rotation on a shaft 162, with four permanent magnets 164 mounted on the periphery of the rotor body 161. Between the permanent magnet insets 164 are raised areas 165 of the rotor body. For example, the raised areas 165 may be oriented along the rotor q-axis and the permanent magnet insets 164 may be centered at the d-axis, with four permanent magnets 164 and four raised areas 165 extending around the periphery of the rotor for a four pole machine. Because of the inherent rotor magnetic saliency provided by this type of rotor, the effective impedance as seen at the stator windings will change with rotor rotational position.

Figure 21:
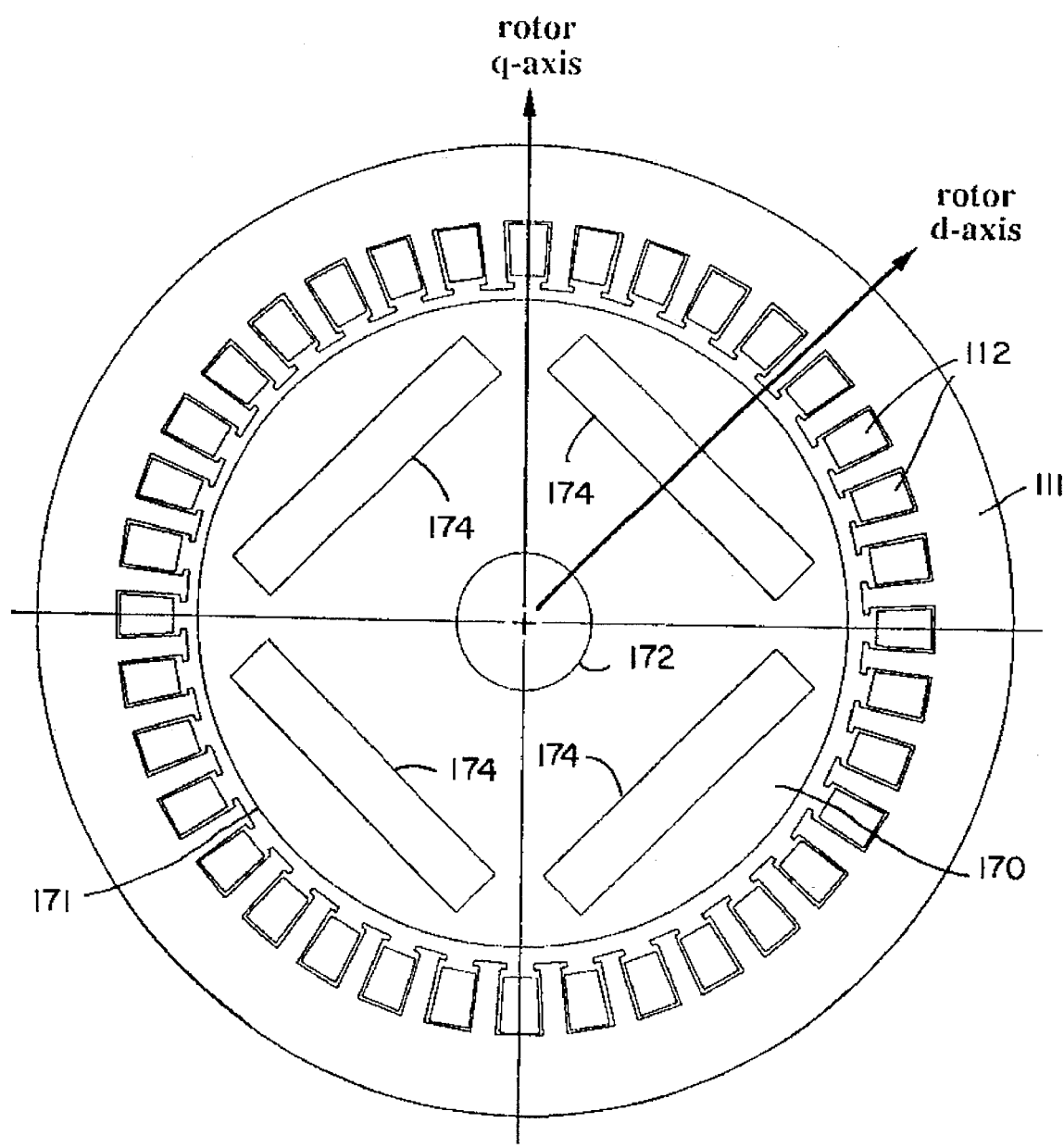
FIG. 21 is a simplified view through a four-pole embedded (buried) permanent magnet synchronous machine with inherent rotor magnetic saliency.

A variation of the permanent magnet machine is shown in FIG. 21, wherein the rotor 170, with a rotor body 171 rotating on a shaft 172, has four permanent magnets 174 imbedded or buried in the rotor body 171 at positions centered on the d-axis. This rotor construction will similarly result in a variation in the effective impedance seen at the stator windings with rotation of the rotor.

Figure 22:
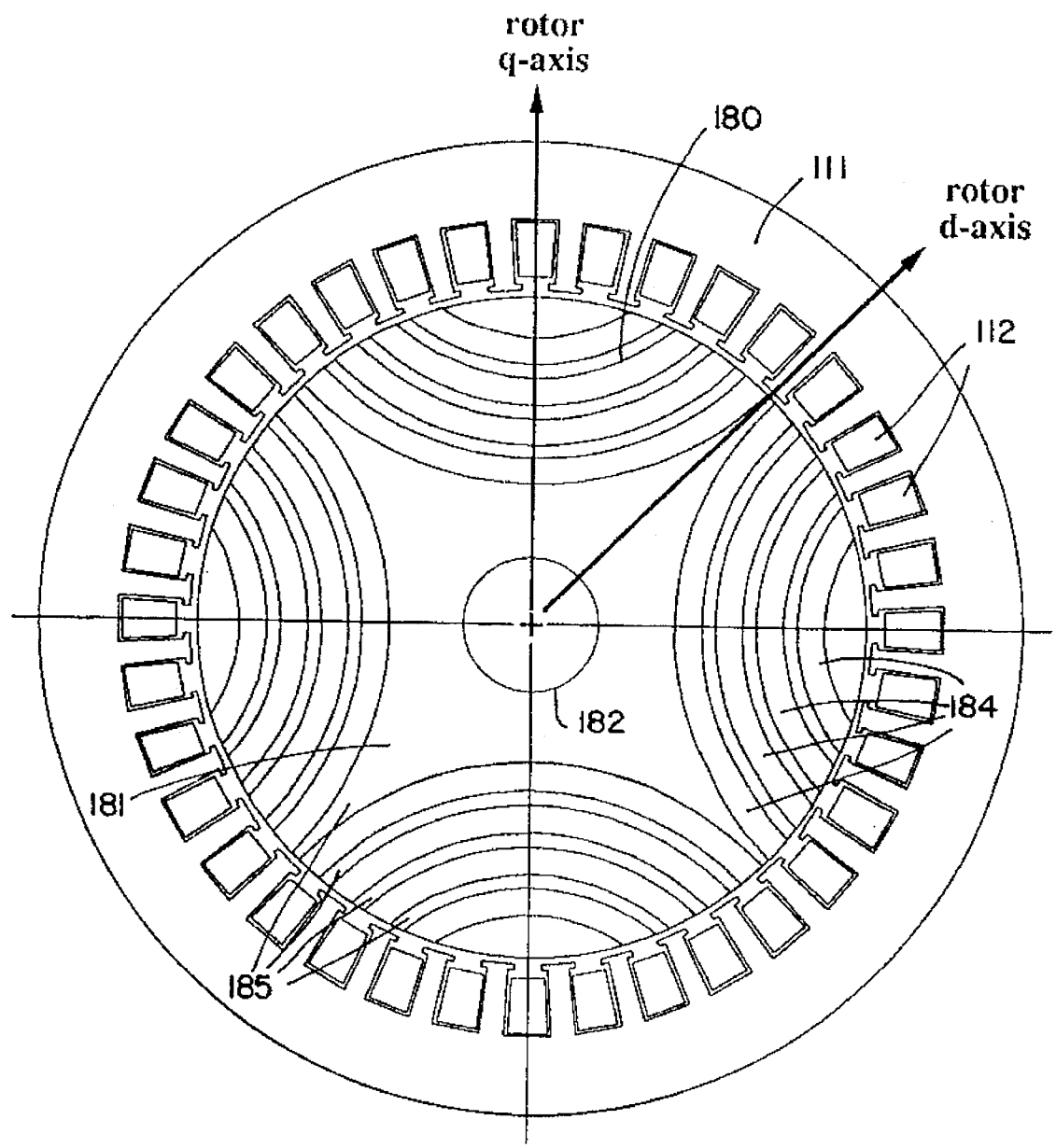
FIG. 22 is a simplified view through a four-pole synchronous reluctance machine with inherent rotor magnetic saliency.

A four pole synchronous reluctance machine with inherent rotor magnetic saliency is shown in FIG. 22. This machine is illustratively shown with a stator 111 having symmetrical three-phase stator windings 112, with the reluctance rotor 180 comprising a rotor body 181 rotating on a shaft 182. The rotor body 181 is formed of curved laminations 184 of ferromagnetic material aligned along one of the axes of the machine, e.g., the q-axis, and non-ferro magnetic material 185 in which the laminations 184 are imbedded and held. The effective impedance at the high frequency of the excitation signal will vary as a function of the rotational position of the rotor 180, which can be utilized to determine rotor position.

Detection of the rotor position with each of the foregoing machines may be carried out in the same manner as described above for the machine 31, preferably by heterodyning and low pass filtering the mixed signal as described above. The filtered heterodyned signal will be of the same form as for an induction machine and can be used, if desired, to drive a Luenberger-style velocity observer. Saturation may introduce additional modulations at both the excitation frequency aligned with the stator current, and at the rotor frequency aligned with the main flux. Unlike the induction machine, the main flux is locked onto the rotor and thus-any additional spatial modulation created by the main flux path saturation will be fixed relative to the motor saliency. Thus, one potentially large source of errors in induction machine drives will generally be small in synchronous and reluctance machine drives. A decoupler as used in the induction machine drive can also be implemented to reduce these errors if they are significant. Although saturation due to rotor currents (loading effects in the induction machine) is absent in such salient machines, stator currents can still create a modulation in the stator leakage inductances. This modulation, however, should be insignificant relative-to the large rotor saliency common in such machines.

Figure 23:
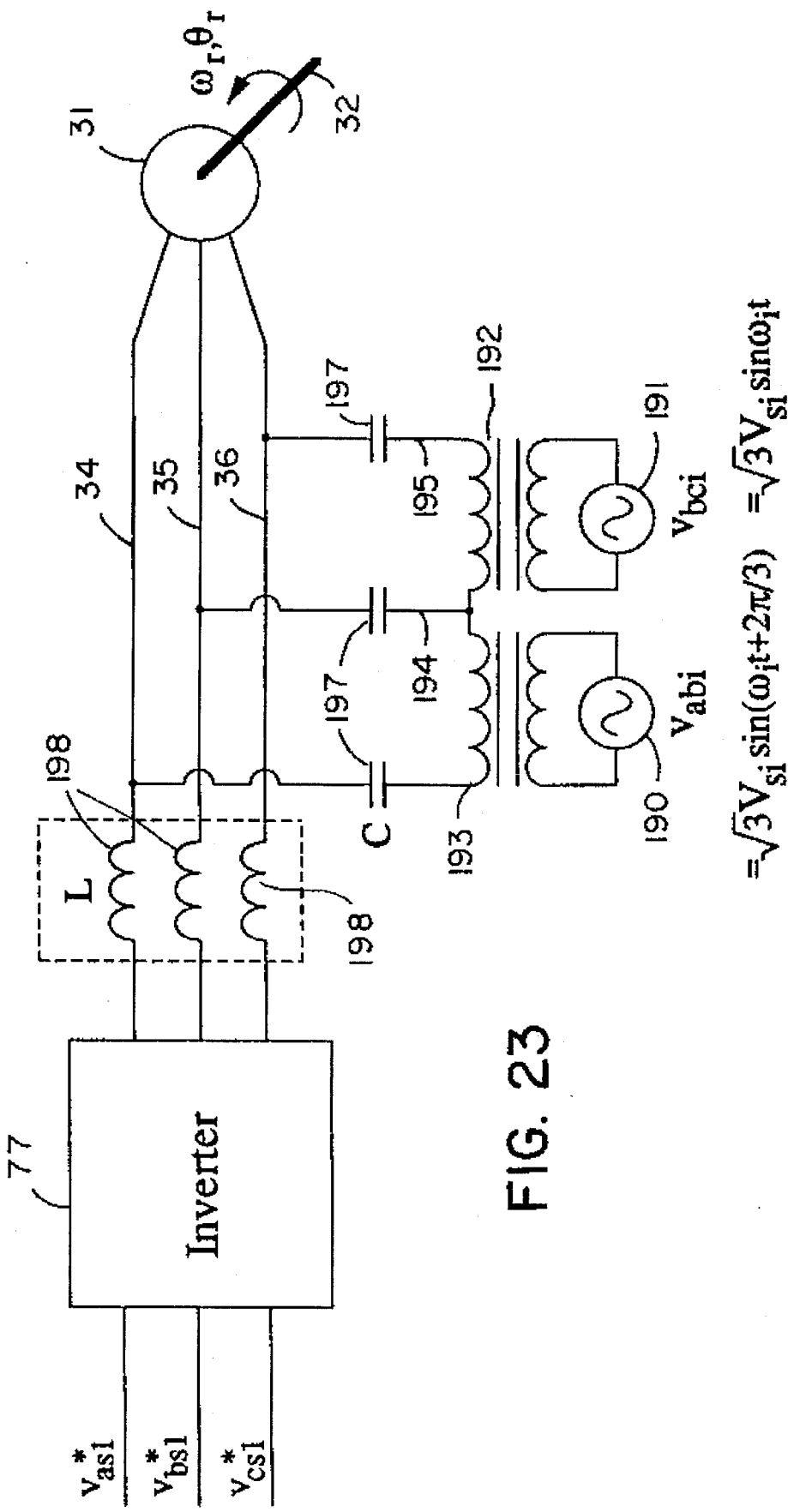
FIG. 23 is a schematic diagram of the implementation of the invention using low power signal injection external to the inverter.

FIG. 23 shows an implementation of the invention in which the high frequency signal is injected into the output supply lines 34, 35 and 36 external to the inverter 77. In this implementation, the inverter 77 receives command signals $V^*_{asl}$, $V^*_{bsl}$ and the $V^*_{csl}$ to cause the inverter to provide output power on the output supply lines 34, 35 and 36 at the fundamental frequency only. High frequency signal generators 190 and 191 of standard design (which may be a single generator with phase shifters), provide the high-frequency low power sine wave signals $V_{abi}=\sqrt{3} V_{si} \sin(\omega_i t + 2\pi/3)$ and $V_{bci}=\sqrt{3} V_{si} \sin \omega_i t$ respectively. The outputs of the signal generators 190 and 191 are provided to a transformer 192 which isolates the low and high power circuitry. Output lines 193, 194, and 195 connected between the secondary of the transformer 192 and the output supply lines 34, 35 and 36. Capacitors 197 connected in the lines 193–195 provide high frequency coupling while blocking low frequencies back toward the signal generators 190 and 191. Inductors 198 connected in the lines 34, 35 and 36 between the inverter 77 and the connections of the lines 193–195 provide a high impedance to the high frequency signals from the signal generators 190 and 191 looking toward the inverter (relative to the motor leakage inductance). The inductors 198 thus block high-frequency signal currents from flowing back into the inverter 77.

The above-described motor drive systems may be implemented utilizing conventional hardware components and circuit designs. Exemplary circuit implementations are described below, but it is understood that these are for purposes of illustration only, and the present invention may utilize any implementation that will carry out the essential functions of the invention.

Figure 24:
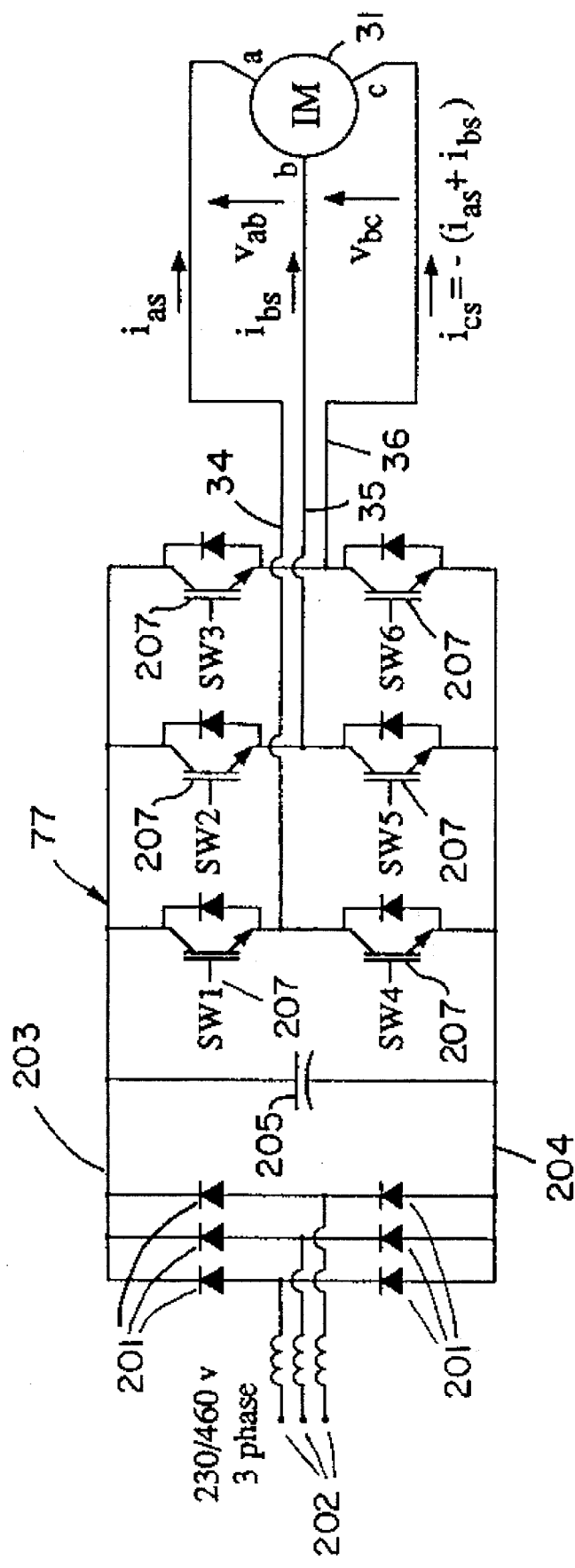
FIG. 24 is a schematic circuit diagram of an exemplary three-phase inverter which may be utilized in the AC machine drive system of the invention.

An exemplary 3-phase inverter topology which may be utilized as the inverter 75 is shown in FIG. 24. The inverter of FIG. 24 utilizes a diode bridge, formed of diodes 201, to rectify the (typically 3-phase) commercial power from power lines 202 to provide DC voltage on DC bus lines 203 and 204, across which an energy storage and filtering capacitor 205 is connected. The DC voltage on the lines 203 and 204 is inverted to 3-phase output voltage on lines 34, 35 and 36 by a 3-phase inverter composed of (e.g.) insulated gate bipolar transistor (IGBT) switching devices 207 connected in a bridge configuration. The switching of the devices 207 is controlled by switching signals provided to the gates of the devices in a conventional manner.

Figure 25:
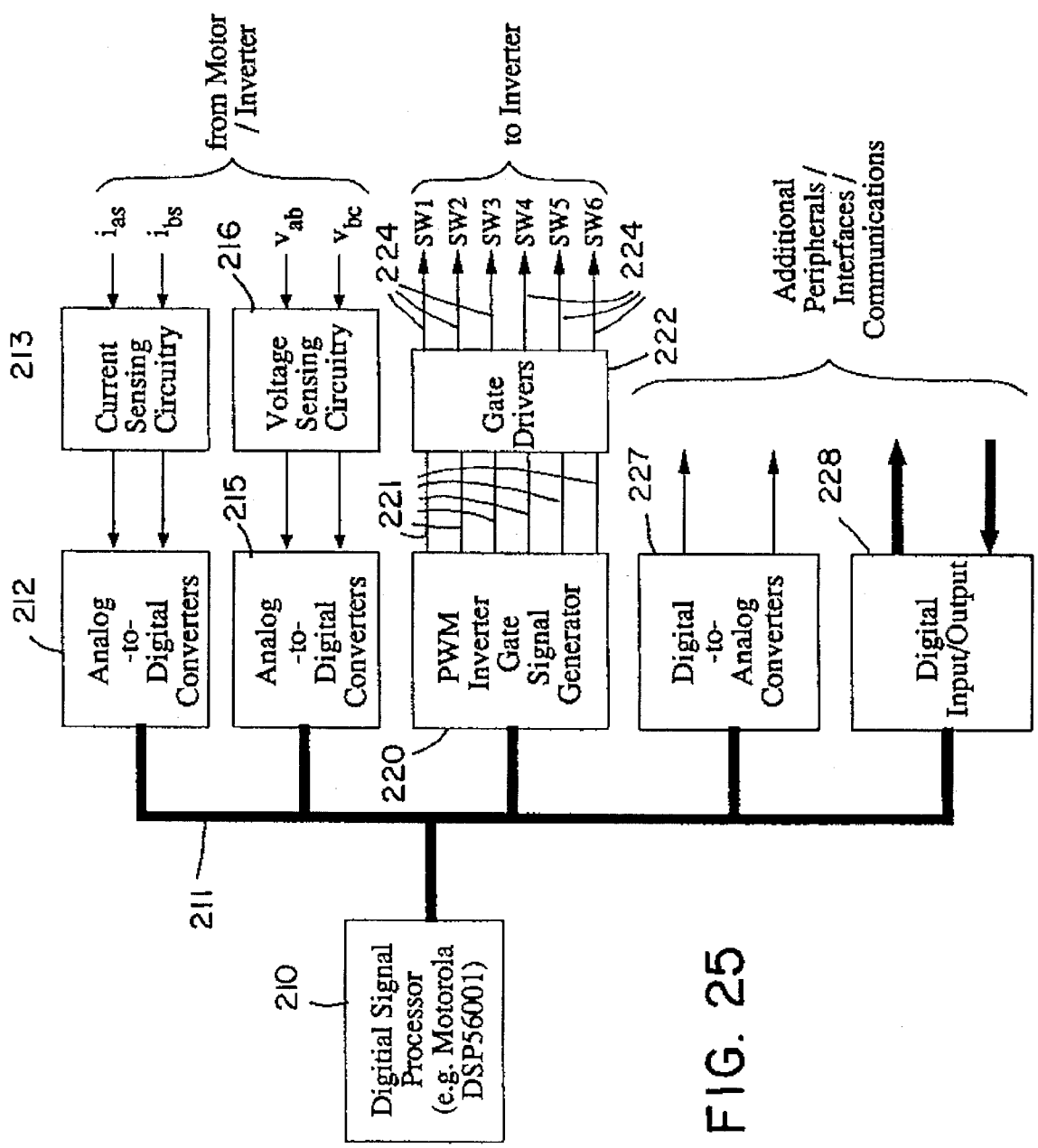
FIG. 25 is a block diagram of a digital signal processor implementation that may be utilized in the AC machine drive system of the invention.

An exemplary system for providing the switching signals to the switches 207 of the inverter of FIG. 24 is shown in FIG. 25. The system of FIG. 25 may be used to provide a digital signal processor based implementation of the drive systems of FIGS. 1, 2 or 3, utilizing the processing of, e.g., FIG. 4 and FIGS. 5, 6 or 7. The system of FIG. 25 includes a digital signal processor (DSP) 210, e.g., a Motorola DSP56001, which is connected by data bus and control lines 211 in a conventional manner to analog-to-digital converters 212 which receive current signals from current sensing circuitry 213, and to analog-to-digital converters 215 which receive voltage signals from voltage sensing circuitry 216, thereby to provide the DSP 210 with data indicative of the current signals $i_{as}$ and $i_{bs}$ and the voltage signals $V_{ab}$ and $V_{bc}$. The DSP 210 provides control and data signals to a PWM inverter gate signal generator 220 which provides output signals on lines 221 to gate drivers 222 which, in turn provide the necessary switching signals on lines 224 to the gates of the switching devices 207. Additional digital to analog converters 227 and digital input and output interfaces and communications ports 228 are in communication with the DSP 210 in a conventional manner. The DSP 210 may be programmed in a conventional and well-known manner to carry out the signal processing in any of the implementations of FIGS. 1–3, or any other motor control implementation, or to simply provide rotor position and/or velocity information.

Figure 26:
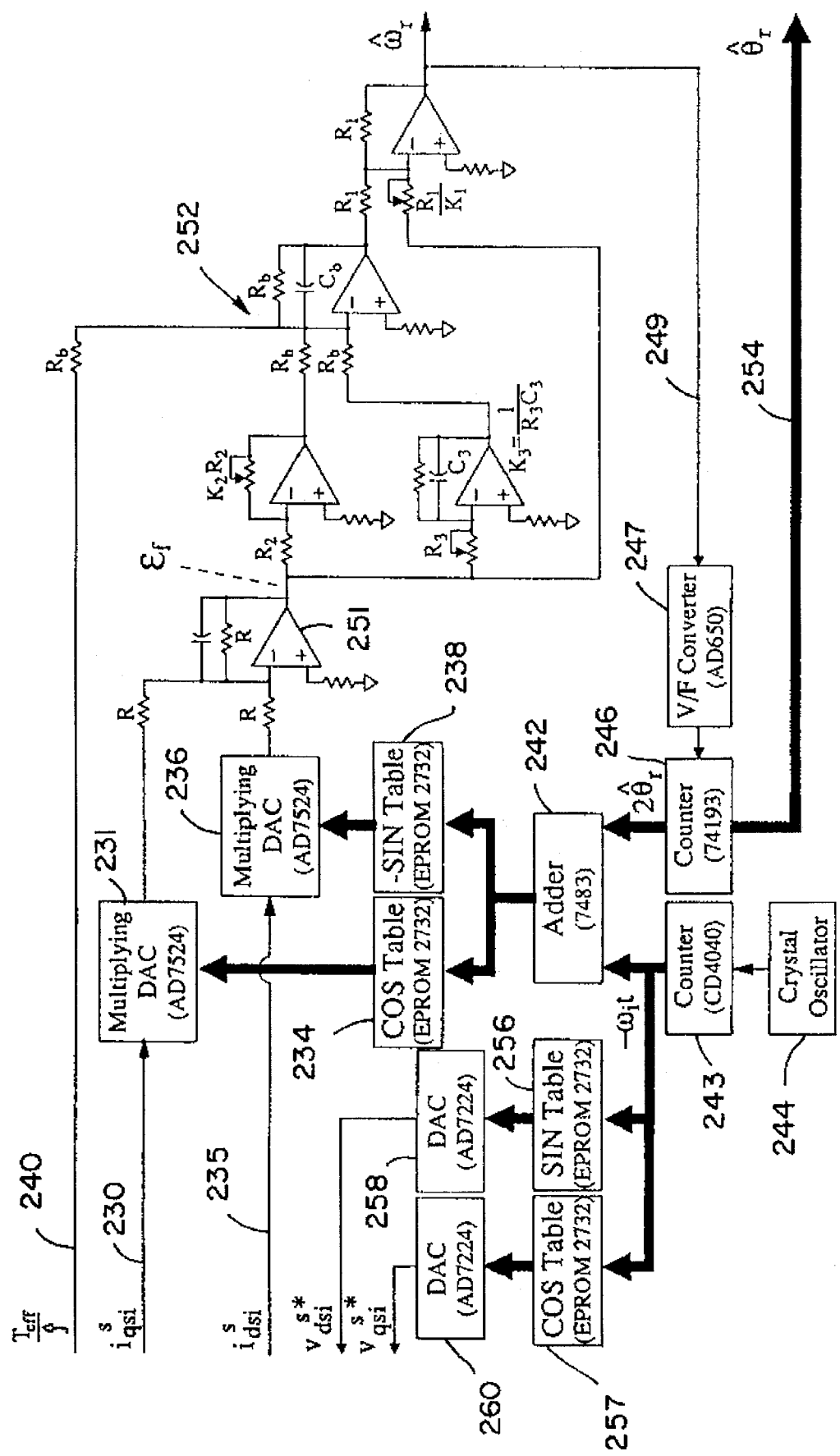
FIG. 26 is a circuit diagram of an exemplary hybrid digital/analog implementation of a position and velocity observer in accordance with the invention.

As an alternative to the fully digital implementation of FIG. 25, the position and velocity observer 43 of the invention may be implemented by a hybrid digital/analog observer as illustrated in FIG. 26. The illustrative implementation of FIG. 26 includes the heterodyning process, a linear state feedback controller, torque command feedforward, and signal command generation. Exemplary integrated circuits which may be used in this implementation are indicated in parenthesis on the units shown in the drawings. An analog signal from the filter and coordinate transform circuit 46, indicative of the current $i_{qsi}^s$, is brought in on a line 230 to a multiplying digital-to-analog converter (DAC) 231. The digital input of the DAC 231 is provided from a cosine table in an EPROM 234. Similarly, an analog signal from the circuit 46, indicative of the signal $i_{dsi}^s$, is brought in on a line 235 to a multiplying DAC 236 which receives its digital input from an EPROM 238 which is programmed with a minus sine table. An analog torque command feedforward signal is brought in on a line 240 from a field-oriented controller, and can be either an estimated or commanded torque quantity. The EPROMS 234 and 238 are driven by an adder 242 which receives inputs from a counter 243 driven by a crystal oscillator 244, and from a counter 246 driven by a voltage to frequency converter 247. The voltage to frequency converter 247 is driven by a signal on a line 249 which is indicative of the estimated velocity $\omega_r$. The outputs of the DACs 231 and 236 are summed in a summing and filter amplifier 251 (which serves as both the summing junction 98 and low pass filter of FIGS. 5–7) to provide an error signal $\epsilon_f$ which is passed through a section 252 where the command signal on line 240 is added to provide the estimated velocity signal $\omega_r$. The section 252 incorporates integrators and summing amplifiers to provide an analog implementation of the observer controller 101 and the mechanical system model 95 of FIGS. 5–7. The converter 247 and counter 246 effectively act as a digital integrator of $\omega_r$. The output of the counter 246 on lines 254 is data corresponding to the position estimate $\theta_r$. The output of the counter 243, in addition to being provided to the adder 242, is also provided to an EPROM 256, programmed with a sine table, and an EPROM 257, programmed with a cosine table. The output of the EPROM 256 is provided to a DAC 258 which provides an analog output signal indicative of $V_{dsi}^{s*}$, and the output of the EPROM 257 is provided to a DAC 260 the analog output of which is the signal $V_{qsi}^{s*}$.

The filter and coordinate transform circuit 46 may be implemented in standard ways. An exemplary circuit providing stator sensing, 3 to 2 phase transformation, and isolation of signal and fundamental current components via first order high- and low-pass filtering is shown in FIG. 27. The equations for the coordinate transformations implemented by the circuit of FIG. 27 are well known. For a three phase supply without a neutral connection, $i_{as}+i_{bs}+i_{cs}=0$, and $$i_{qs}^s = \frac{2}{3}\left[i_{as}^s - \frac{1}{2}(i_{bs}^s + i_{cs}^s)\right] = i_{as}^s \tag{22}$$

$$i_{ds}^s = -\frac{1}{\sqrt{3}}(i_{bs}^s - i_{cs}^s) = -\frac{1}{\sqrt{3}}(i_{as}^s + 2i_{bs}^s) \tag{23}$$

The phase a stator current is sensed by, e.g., a Hall-effect current sensor acting as the sensor 39, which provides an output signal on a line 266 indicative of $i_{as}$, which is defined equal to $i_{qs}^s$, and the signal is passed through a low-pass output filter circuit 267 to provide the signal $i_{qsl}^s$, and through a high-pass filter 268 to provide the signal $i_{qsl}^s$. Similarly the phase b stator current is detected by a Hall-effect sensor 39 which provides an output signal on a line 271, indicative of $i_{bs}$, which is passed through a summing amplifier 272 where it is appropriately summed with the signal $i_{as}$ to provide the signal $i_{ds}^s$ on a line 273 The signal on the line 273 is provided to a low-pass filter 274 to provide the signal $i_{dsl}^s$, and to a high-pass filter 275 to provide the signal $i_{dsi}^{sh}$. The signals $i_{dsi}^s$ and $i_{qsi}^s$ will contain higher harmonics at the inverter switching frequency, but these are of low amplitude and can be filtered out within the observer.

A similar circuit can be used to provide the voltages $V_{qsl}^s$, $V_{dsl}^s$, $V_{qsi}^s$ and $V_{dsi}^s$. All computations and transformations are based on a per phase wye connection line-to-neutral basis. Thus, all transformations used within the invention are independent of whether the motor is delta or wye connected. The voltages measured across lines 34, 35, and 36 are line-line voltages $V_{ab}^s$ and $V_{bc}^s$ (and thus also $V_{ca}^s$), where $V_{ab}^s=V_{as}^s-V_{bs}^s$, etc. Transformation to 2 phase quantities is simply $$\begin{aligned}v_{qs}^s &= \frac{2}{3}\left(v_{as}^s - \frac{1}{2}(v_{bs}^s + v_{cs}^s)\right) \\ &= \frac{2}{3}\left((v_{as}^s - v_{bs}^s) + \frac{1}{2}(v_{bs}^s - v_{cs}^s)\right) \\ &= \frac{2}{3}v_{ab}^s + \frac{1}{3}v_{bc}^s\end{aligned} \tag{24}$$

$$\begin{aligned}v_{ds}^s &= -\frac{1}{\sqrt{3}}(v_{bs}^s - v_{cs}^s) \\ &= -\frac{1}{\sqrt{3}}v_{bc}^s\end{aligned} \tag{25}$$

Figure 28:
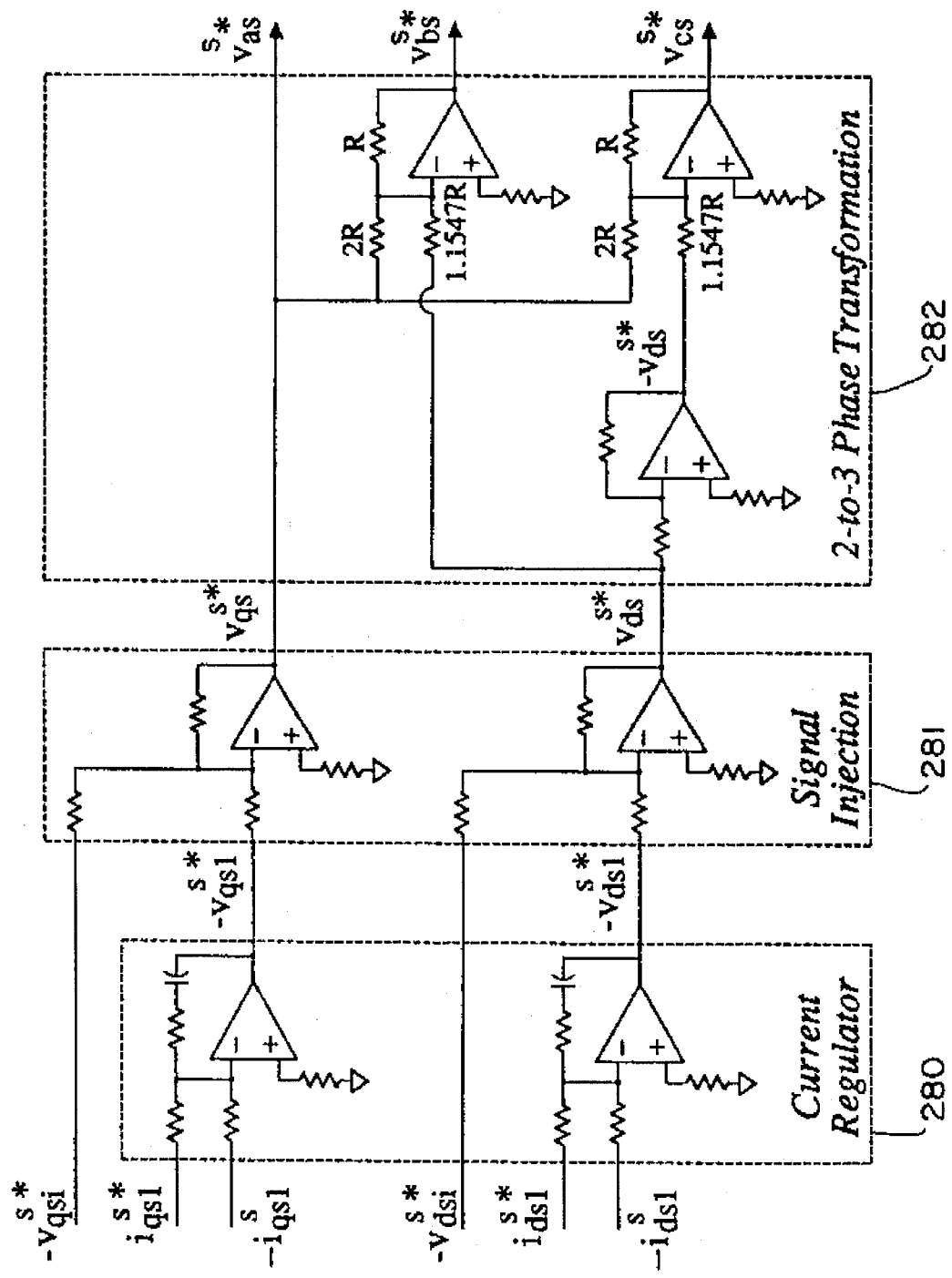
FIG. 28 is a schematic circuit diagram of an exemplary analog circuit which generates voltage references for a pulse width, pulse density, or space vector modulated voltage source inverter.

An exemplary analog circuit that can be utilized to generate voltage references to be provided to a pulse-width-modulation (PWM) voltage source inverter is illustrated in FIG. 28. The circuit of FIG. 28 includes a current regulator 280 which receives the input signals as shown and provides output signals $-V_{qsl}^{s*}$ and $-V_{dsl}^{s*}$. These signals and the injected frequency signals $-V_{qsl}^{s*}$ and $-V_{*dsi}^{s}$ are provided to a signal injection circuit 281 which generates the signals $V_{qs}^{s*}$ and $V_{ds}^{s*}$. These output signals are provided to a 2-phase to 3-phase transformation circuit 282 which generates the voltage references $V_{as}^{s*}$, $V_{bs}^{s*}$, and $V_{cs}^{s*}$. Without a zero sequence component; i e , $V_{0s}^{s*}=0$, then $V_{as}^{s*}+V_{bs}^{s*}+V_{cs}^{s*}=0$, and $$v_{as}^{s*} = v_{qs}^{s*} \tag{26}$$

$$v_{bs}^{s*} = -\frac{1}{2}(v_{qs}^{s*} + \sqrt{3}\, v_{ds}^{s*}) \tag{27}$$

$$v_{cs}^{s*} = -\frac{1}{2}(v_{qs}^{s*} - \sqrt{3}\, v_{ds}^{s*}) \tag{28}$$

The reference voltages generated in FIG. 28 are phase voltages for a Y (wye) equivalent system. The inverter will generate line-line voltages based on these phase voltage references; e.g., $V_{ab}^s=V_{as}^{s*}-V_{bs}^{s*}$, independent of whether the motor is delta or wye connected. The current regulator 280 is a stationary frame proportional and integral linear controller which is simple to implement and has adequate performance for many applications. If very high performance is required, higher performance current regulators such as the synchronous frame proportional and integral controller may be utilized.

With the applied signal voltages in 2-phase quantities being $$V_{qsi}=V_{si}\cos\omega_i t$$

$$V_{dsi}=-V_{si}\sin(\omega_i t),$$

the actual applied signal voltages in 3-phase (machine frame) quantities are:

$$V_{asi}=V_{si}\cos\omega_i t$$

$$V_{bsi}=V_{si}\cos(\omega_i t-2\pi/3)$$

$$V_{csi}=V_{si}\cos(\omega_i t+2\pi/3)$$

The resulting 3-phase stator signal currents (assuming the leakage reactance dominates the terminal impedance as before) are:

$$i_{asi}=I_{i0}\sin\omega_i t+I_{i1}\sin(2\theta_r-\omega_i t)$$

$$i_{bsi}=I_{i0}\sin(\omega_i t-2\pi/3)+I_{i1}\sin(2\theta_r-\omega_i t-2\pi/3)$$

$$i_{csi}=I_{i0}\sin(\omega_i t+2\pi/3)+I_{i1}\sin(2\theta_r-\omega_i t+2\pi/3)$$

Heterodyning the 3-phase quantities in the form:

$$\epsilon=2/3[i_{asi}\cos(2\hat\theta_r-\omega_i t)+i_{bsi}\cos(2\hat\theta_r-\omega_i t-2\pi/3)+i_{csi}\cos(2\hat\theta_r-\omega_i t+2\pi/3)] \tag{29}$$

yields the desired error term:

$$\epsilon=I_{i0}\sin(2\hat\theta_r-2\omega_i t)+I_{i1}\sin(2(\theta_r-\hat\theta_r)) \tag{30}$$

If a neutral connection is absent, as is typical, then $$i_{as}+i_{bs}+i_{cs}=0$$

In this case, $i_{cs}$ is often not measured, and is calculated if needed from $$i_{cs}=-i_{as}-i_{bs}$$

The heterodyning can then be simplified to $$\epsilon = 2/\sqrt{3}\ [i_{asi}\sin(2\hat{\theta}_r - \omega_i t + \pi/3) + i_{bsi}\cos(2\hat{\theta}_r - \omega_i t)] \quad (31)$$

Note that heterodyning is mathematically equivalent to a coordinate transformation. The heterodyning can operate or occur in any desired reference frame. The 2-phase d-q reference frame is generally desirable for conceptual reasons.

Figure 29:
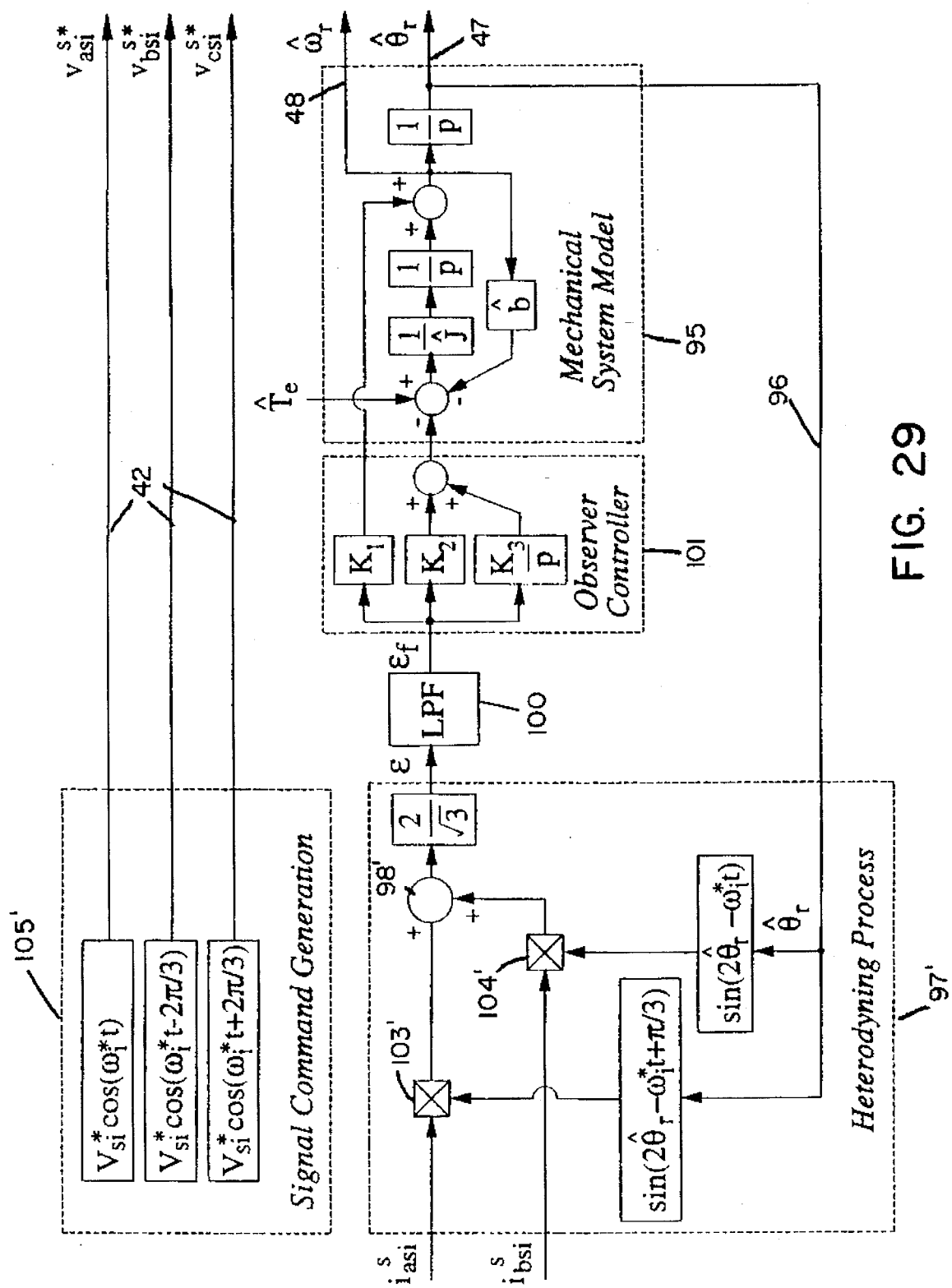
FIG. 29 is a schematic diagram of a closed loop position and velocity observer utilizing 3-phase quantities.

An implementation of a heterodyning demodulation scheme utilizing 3-phase machine-frame quantities, and assuming no neutral convertion, i.e., $i_{as}+i_{bs}+i_{cs}=0$, is shown in FIG. 29. The position and velocity observer of FIG. 29 is similar to that of FIG. 5, and includes a signal command generator which provides the three phase, high (signal) frequency command signals. The low pass filter 100, observer controller 101, and mechanical system model 95 are the same as in FIG. 5. The heterodyning process 97' calculates the functions $\sin(2\hat{\theta}_r-\omega_i*t+\pi/3)$ and $\sin(2\hat{\theta}_r-\omega_i*t)$ and multiples these functions times the current signals $i_{asi}{}^s$ and $i_{bsi}{}^s$, respectively performs the addition at a junction 98', and applies a factor $2/\sqrt{3}$ to provide the error signal $\epsilon$ in Equation (31).

For convenience, the following is a listing of the nomenclature and abbreviations which have been used herein.

| | |
|---|---|
| BPF | band pass filter |
| HPF | high pass filter |
| LPF | low pass filter |
| PWM | pulse width modulated (inverters) |
| ^ | superscript denoting estimated quantities. |
| * | superscript denoting commanded or reference quantities |
| e | superscript denoting a synchronous frame quantity |
| s | superscript denoting a stationary frame quantity |
| a | rotor slot opening depth dimension |
| b | rotor slot opening width dimension |
| $B_{sl1}$ | mean flux density along the rotor slot opening side due to the fundamental rotor current component |
| $\hat{b}$ | estimated net rotor and load viscous damping |
| $I_{i0}$ | amplitude of the undesirable component in the heterodyned signal, $\epsilon$, i.e. $I_{i0} \approx \dfrac{V_{si}}{\omega_i}\ \dfrac{L_{ls}+L_{lr}}{(L_{ls}+L_{lr})^2-\Delta L_{lr}^2}$ if leakage inductance dominates impedance at signal frequency |
| $I_{i1}$ | amplitude of the component in the heterodyned signal, $\epsilon$, containing the desirable position information; i.e. $I_{i1} \approx \dfrac{V_{si}}{\omega_i}\ \dfrac{\Delta L_{lr}}{(L_{ls}+L_{lr})^2-\Delta L_{lr}^2}$ if leakage inductance dominates impedance at signal frequency |
| $i_{as}, i_{bs}, i_{cs}$ | measured three phase stator currents. |
| $v_a, v_b, v_c$ | measured three phase stator voltages |
| $i_{rb1}$ | fundamental component of the individual rotor bar/slot current (at slip frequency) |
| $i_{rbi}$ | signal frequency component of the individual rotor bar/slot current |
| $i^{s*}_{qds}$ | commanded stator current vector in the stationary frame; i.e. $i^{s*}_{qds} = [i^{s*}_{qs}, i^{s*}_{ds}]$ |
| $i^s_{qds}$ | measured/actual stator current voltage vector in the stationary frame; i.e. $i^s_{qds} = [i^s_{qs}, i^s_{ds}]$; includes fundamental and signal frequency components |
| $i^s_{qds1}$ | fundamental (driving frequency component of the measured stator current vector in two-phase stationary frame coordinates; i.e. $i^s_{qds1} = [i^s_{qs1}, i^s_{ds1}]$. |
| $i^s_{qdsh}$ | harmonic frequency components of the measured stator current vector in two-phase stationary frame coordinates; i.e. $i^s_{qdsh} = [i^s_{qsh}, i^s_{dsh}]$. |
| $i^s_{qdsi}$ | signal frequency component of the measured stator current vector in two-phase stationary frame coordinates; i.e. $i^*_{qdsi} = [i^s_{qsi}, i^s_{dsi}]$. |
| $\hat{j}$ | estimated net rotor and load inertia |
| $K_1, K_2, K_3$ | derivative, proportional, and integral state feedback gains of observer controller, respectively |
| L | motor lamination stack length (m) |
| $\Delta L_{lr}$ | amplitude of the rotor leakage inductance modulation seen by the stator windings |
| $L_{lr}$ | average rotor leakage inductance seen by the stator windings |
| $L_{lri}$ | average rotor leakage inductance as seen by the stator windings at the signal frequency, $\omega_i$ |
| $L_{ls}$ | stator leakage inductance |
| mmf | magnetomotive force |
| p | derivative operator with respect to time; p = d/dt |
| $r_r$ | rotor resistance seen by the stator windings. |
| $r_{ri}$ | rotor resistance seen by the stator windings at the signal frequency, $\omega_i$ |
| $R_{sl}$ | reluctance across a slot opening ($\approx b/(\mu_0 aL)$) |
| t | time |
| $T_e$ | electromagnetic torque |
| $v^s_{qds}$ | measured/actual stator voltage vector in two-phase stationary frame coordinates; i.e. $v^s_{qds} = [v^s_{qs}, v^s_{ds}]$, includes fundamental and signal frequency components. |
| $v^s_{qds1}$ | fundamental (driving) frequency component of the measured stator voltage vector in two-phase stationary frame coordinates; i.e. $v^s_{qds1} = [v^s_{qs1}, v^s_{ds1}]$ |
| $v^s_{qdsi}$ | signal frequency component of the measured stator voltage vector in two-phase stationary frame coordinates; i.e. $v^s_{qdsi} = [v^s_{qsi}, v^s_{dsi}]$ |
| $V^s_{dsi}$ | amplitude of the measured signal frequency d-axis voltage; $v^s_{dsi} = V^s_{dsi}\sin(\omega_i t)$ |
| $V^s_{qsi}$ | amplitude of the measured signal frequency q-axis voltage; $v^s_{qsi} = V^s_{qsi}\cos(\omega_i t)$ |
| $V^s_{qdsi}$ | vector containing the amplitudes of the measured signal frequency voltages in two-phase stationary frame coordinates; i.e. $V^s_{qdsi} = [V^s_{qsi}, V^s_{dsi}]$ |
| $V^*_{si}$ | amplitude of the commanded signal frequency voltage; i.e. $v^{s*}_{qsi} = V^*_{si}\cos(\omega_i*t)$ |
| $V_{si0}$ | average amplitude of the measured signal frequency voltages; $V_{si0} = (V^s_{dsi} + V^s_{qsi})/2$ |
| $Y_{i0}$ | amplitude of the undesirable component in the heterodyned signal, $\epsilon$; i.e. $Y_{i0} \approx \dfrac{1}{\omega_i}\ \dfrac{L_{ls}+L_{lr}}{(L_{ls}+L_{lr})^2-\Delta L_{lr}^2}$ if leakage inductance dominates impedance at signal frequency |
| $Y_{i1}$ | amplitude of the component in the heterodyned signal, $\epsilon$, containing the desirable position information; i.e. $Y_{i1} \approx \dfrac{1}{\omega_i}\ \dfrac{\Delta L_{lr}}{(L_{ls}+L_{lr})^2-\Delta L_{lr}^2}$ if leakage inductance dominates impedance at signal frequency |
| $\epsilon$ | error signal obtained after heterodyning |
| $\epsilon_f$ | error signal obtained after heterodyning and low pass filtering |
| $\lambda_r$ | rotor flux magnitude for field orientation |
| $\mu$ | permeability (H/m) |
| $\mu_0$ | permeability of free space and air, (= $4\pi 10^{-7}$H/m) |
| $\sigma$ | electrical conductivity (S/m) |
| $\theta_s$ | induction motor slip angle (electrical radians or degrees) |
| $\theta_r$ | rotor position (electrical radians or degrees) |
| $\theta_{rf}$ | rotor flux angle (electrical radians or degrees) |
| $\omega_e$ | fundamental excitation frequency (radians/sec.) |
| $\omega_h$ | frequency of harmonics, e.g. inverter switching frequencies (radians/second) |

| | |
|---|---|
| $\omega_i$ | signal frequency (radians/second) |
| $\omega_r$ | rotor angular velocity (electrical radians/second) |
| $\dot{\omega}_r$ | rotor angular acceleration (electrical radians/second$^2$) |

It should be apparent that the present invention is also applicable to linear motors, including linear induction, synchronous, and reluctance motors. Linear transducers are generally more costly and less reliable than rotary transducers, and thus the need for transducerless sensors in position estimation in linear machines is particularly acute. The theory and implementation of the invention are the same for linear machines as for rotary machines, although rotational quantities must be replaced with quantities relating to linear translation, e.g., $\theta_r \rightarrow X\pi/\tau_p$ (where $\tau_p$ is pole pitch, and x is linear position), $J \rightarrow M$ (mass), etc.

In the case of a linear machine, the spatially modulated element may be either the stationary or the moving element. Thus, the motor drive of the present invention may be used with such machines but may provide drive power to either the stationary or moving element.

Figure 30:
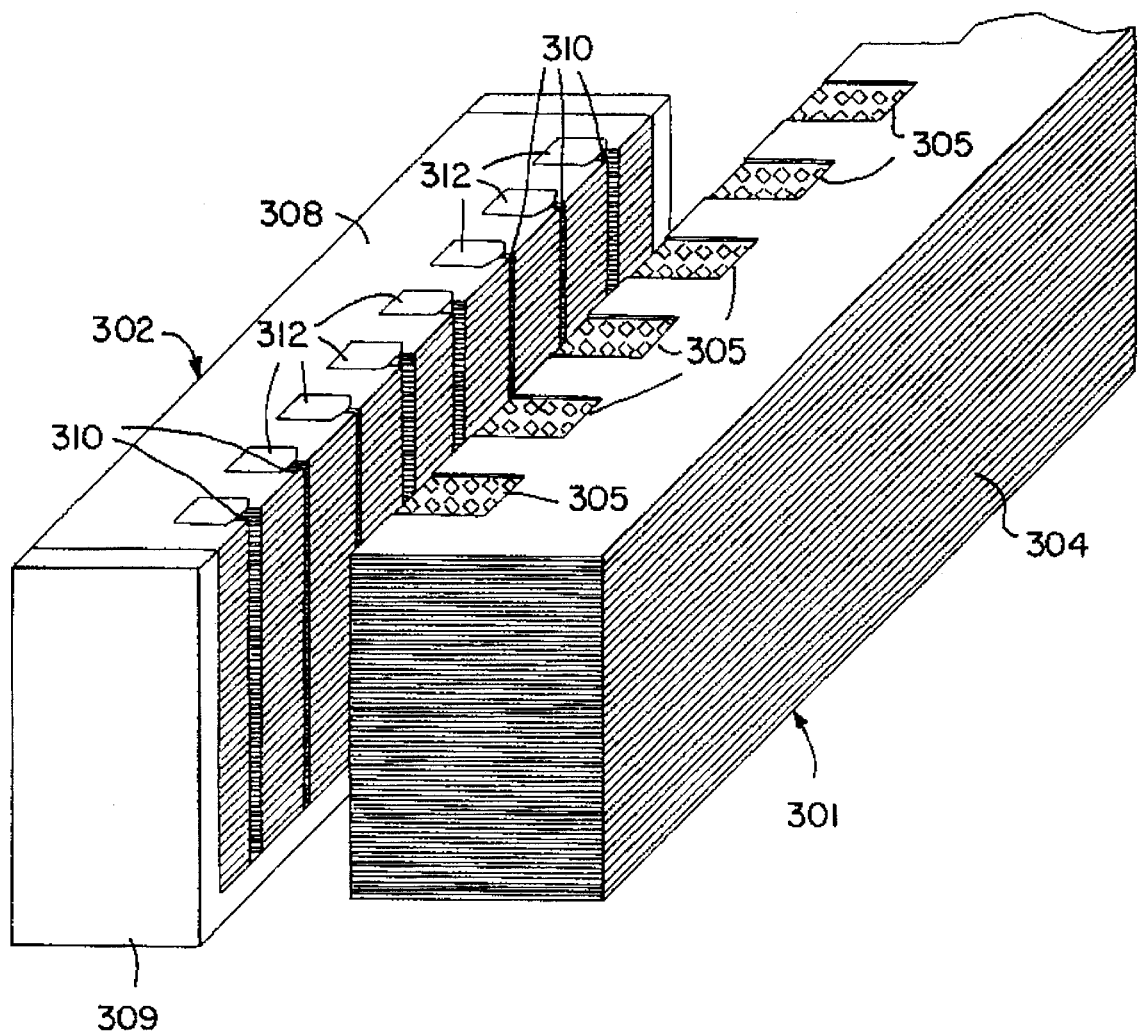
FIG. 30 is an illustrative simplified perspective view of a linear motor incorporating the present invention.

An exemplary linear motor in accordance with the present invention is shown in FIG. 30. The motor has a long stationary primary structure 301 (corresponding to a stator) and a short, movable secondary structure 302 (corresponding to a rotor). The secondary structure 302 may be supported for linear motion by any desired structure (not shown). For example, the secondary structure 302 could be mounted on wheels, roller bearings, or air bearings, and held in a track (not shown) in a desired relationship to the primary structure 301. The primary structure 301 has a frame 304 formed, e.g., of laminated steel, and a plurality of stator or primary windings 305 in regularly spaced slots. The structure of the primary 301 is essentially that of the stators of any of the machines of FIGS. 17–22 but laid flat. The long primary structure 301 may have several repeating segments, each corresponding to a single stator of a rotary machine laid flat and each segment provided with balanced polyphase power at the drive and signal frequencies in the same manner as discussed above.

The secondary structure 302 has a body 308 of metal laminations supported on a carriage frame 309, with a plurality of regularly spaced slots 310 cut in the body. Conductive bars 312 constituting secondary windings are mounting in the secondary body 308 behind the slots 310 and correspond to the conductive bars (secondary windings) of the squirrel cage rotors of FIGS. 17–19 and are connected together in a manner similar to a squirrel cage rotor. The width of the slots 310 varies in a regular pattern to create a spatial modulation in the secondary leakage inductance as seen by the primary. The linear motor may have spatial modulation incorporated therein in any other suitable manner, for example, using any of the structures described above for rotors. The invention is applicable to other types of linear AC machines such as synchronous reluctance and some permanent magnet synchronous machines containing inherent magnetic saliency on the secondary, the structure of the secondary being essentially that of the rotors of any of the machines of FIGS. 20–22 but laid flat. Other variations are also apparent; for example, the secondary could be the long element and the primary the short element, the rotor could have conductors on both sides with a primary on both sides of the stator, etc. It is understood that the drive systems of the present invention may thus be used with either rotating or linear machines. In either case, the motor has a primary and a secondary movable with respect to each other, the secondary magnetically coupled to the primary to provide impedance as seen by the primary which varies as a function of the relative position of the primary and secondary. Power is provided to the primary at the fundamental drive frequency and at the higher signal frequency, and the response of the primary at the signal frequency is measured to allow the relative position of the primary and secondary to be determined.

It is understood that the invention is not confined to the particular illustrative embodiments described herein, but embraces all such modified forms thereof as come within the scope of the following claims.

What is claimed is:

1. A motor drive system comprising:
   (a) an induction motor including a stator with a plurality of stator windings thereon, and a rotor mounted for rotation within the stator, the rotor including means for providing impedance as seen by the stator windings which varies as a function of the rotational position of the rotor;
   (b) drive means, connected to the stator windings, for providing AC drive power to the stator windings at a fundamental drive frequency of the motor and for also providing power to the stator windings at a signal frequency which is substantially higher than the drive frequency; and
   (c) means for measuring the response of the stator windings to the signal frequency power to determine the variation of the response as a function of time during operation of the motor whereby the angular position or the speed of the rotor or both can be determined.

2. The motor drive system of claim 1 wherein the rotor is constructed to have a leakage inductance which varies as a function of the rotational position of the rotor at the signal frequency to provide impedance as seen by the stator windings which varies with rotor position.

3. The motor drive system of claim 2 wherein the leakage inductance of the rotor varies as a periodic function of the rotational position of the rotor and has a period of 180 electrical degrees.

4. The motor drive system of claim 1 wherein the drive means includes an inverter having a plurality of switching devices connected in a bridge configuration and control means for controlling the switching of the switching devices to provide AC power to the stator windings, wherein the control means controls the switching of the switching devices of the inverter in a pulse width modulated manner at a high switching frequency to provide pulse width modulated output power which includes a component at the fundamental drive frequency and a component at the high signal frequency.

5. The motor drive system of claim 1 wherein the means for measuring the response of the stator to signal frequency power includes a heterodyne demodulator mixing a signal which is a function of the high signal frequency with the response from the stator windings to provide a signal indicative of the rotational position of the rotor.

6. The motor drive system of claim 1 wherein the induction motor is a three phase motor having three input lines, wherein the means for measuring includes means for detecting the currents in the input lines to the motor, means for transforming the detected currents to equivalent q-axis and d-axis current signals $i^s_{qsi}$ and $i^s_{dsi}$, respectively, means for heterodyning the current signals to provide a mixed signal $\epsilon$ which is a function in accordance with the expression:

$$\epsilon = i^s_{qsi}\cos(2\theta_r - \omega_i t) - i^s_{dsi}\sin(2\theta_r - \omega_i t),$$

where $\hat{\theta}_r$ is an existing estimate of the rotor position and $\omega_i$ is the signal frequency, and including a low pass filter filtering the signal $\epsilon$ to provide a filtered signal $\epsilon_f$ which is a function in accordance with the expression $$\epsilon_f = I_{il} \sin[2(\theta_r - \hat{\theta}_r)]$$

where $I_{il}$ is a current amplitude and $\theta_r$ is the actual rotor position.

7. The motor drive system of claim 6 wherein the measuring means further includes an observer controller receiving the filtered signal $\epsilon_f$, and a model of the mechanical system of the motor, the observer controller providing a selectively weighted and conditioned version of the signal to the mechanical system model, the mechanical system model also receiving a torque input signal and providing output signals which are estimates of rotor speed $\hat{\omega}_r$ and position $\hat{\theta}_r$, the position estimate $\hat{\theta}_r$ being fed back to the means for heterodyning.

8. The motor drive system of claim 1 wherein the drive means includes a current regulated inverter and the means for measuring provides a signal indicative of the rotational position of the rotor, and including controller means for controlling the power applied by the inverter to the motor to control its speed and torque, the controller means receiving input signals indicating the desired speed and torque of the motor, and also receiving the signal indicative of the rotational position of the rotor from the means for measuring, and for providing output signals to the current regulated inverter which indicate the desired output currents.

9. The motor drive system of claim 1 wherein the drive means comprises an inverter connected to the stator windings to provide the AC drive power on supply lines to the stator windings at the fundamental frequency and signal generators coupled to the supply lines to provide power to the stator windings at the signal frequency.

10. The motor drive system of claim 1 wherein the motor is a three phase motor and the drive means provides balanced power at the drive frequency and the signal frequency to the three phase stator windings.

11. A motor drive for providing drive power to polyphase AC motors of the type which have stator windings and a rotor which is constructed to provide impedance as seen by the stator windings which varies as a periodic function of the rotational position of the rotor, comprising:

(a) an inverter bridge adapted to receive power and having a plurality of switching devices which can be switched to provide polyphase AC power at output supply lines of the inverter;

(b) control means for controlling the switching of the switching devices of the inverter to provide AC power at the output terminals of the inverter which can be provided to stator windings of an AC motor, wherein the control means controls the switching of the switching devices of the inverter to provide output power which includes a polyphase component at a fundamental drive frequency for a motor and a balanced polyphase component at a substantially higher signal frequency; and (c) means for measuring the response of the stator windings at the output supply lines to the signal frequency power to determine the variation of the response as a function of time during operation of the motor whereby the angular position or the speed of the rotor or both can be determined.

12. The motor drive of claim 11 wherein the means for measuring the response of the stator windings to the signal frequency power includes a heterodyne demodulator mixing a signal which is a function of the high signal frequency with the response from the stator windings to provide a signal indicative of the rotational position of the rotor.

13. The motor drive of claim 11 wherein the inverter is a current regulated inverter.

14. The motor drive of claim 13 wherein the means for measuring provides a signal indicative of the rotational position of the rotor, and including controller means for controlling the power applied by the inverter to the motor to control its speed and torque, the controller means receiving input signals indicating the desired speed and torque of the motor, and also receiving the signal indicative of the rotational position of the rotor from the means for measuring, and for providing output signals to the current regulated inverter which indicate the desired output currents.

15. The motor drive of claim 11 wherein the induction motor is a three phase motor having three input lines, wherein the means for measuring includes means for detecting the currents in the input lines to the motor, means for transforming the detected currents to equivalent q-axis and d-axis current signals $i^s_{qsi}$ and $i_{dsi}$, respectively, means for heterodyning the current signals to provide a mixed signal $\epsilon$ which is a function in accordance with the expression:

$$\epsilon = i_{qsi}^s \cos(2\hat{\theta}_r - \omega_i t) - i_{dsi}^s \sin(2\hat{\theta}_r - \omega_i t),$$

where $\hat{\theta}_r$ is an existing estimate of the rotor position and $\omega_i$ is the signal frequency, and including a low pass filter filtering the signal $\epsilon$ to provide a filtered signal $\epsilon_f$ which is a function in accordance with the expression $$\epsilon_f = I_{il} \sin[2(\theta_r - \hat{\theta}_r)]$$

where $I_{il}$ is a current amplitude level and $\theta_r$ is the actual rotor position.

16. The motor drive of claim 15 wherein the measuring means further includes an observer controller receiving the filtered signal $\epsilon_f$, and a model of the mechanical system of the motor, the observer controller providing a selectively weighted and conditioned version of the signal $\epsilon_f$ to the mechanical system model, the mechanical system model also receiving a torque input signal and providing output signals which are estimates of rotor speed $\hat{\omega}_r$ and position $\hat{\theta}_r$, the position estimate $\hat{\theta}_r$ being fed back to the means for heterodyning.

17. A motor drive for providing drive power to polyphase AC motors such as motors of the type which have stator windings and a rotor which is constructed to provide impedance as seen by the stator windings which varies as a periodic function of the rotational position of the rotor, comprising:

(a) drive means, having output supply lines which can be connected to the stator windings, for providing polyphase AC drive power at a fundamental drive frequency to a motor connected to the output supply lines to receive the AC drive power and for also providing balanced polyphase power to the output supply lines at a signal frequency which is substantially higher than the drive frequency;

(b) sensors connected to the output supply lines sensing the response of the motor to the power provided by the drive means and providing output signals indicative of the response; and (c) a heterodyne demodulator connected to receive the signals from the sensors and mix a signal which is a function of the high signal frequency with the response signals from the sensors to provide a signal indicative of the rotational position of the rotor.

18. The motor drive of claim 17 further including a transform circuit means for receiving the signals from the sensors and providing equivalent q-axis and d-axis current signals, and wherein the heterodyne demodulator mixes signals at the high signal frequency with the q-axis and d-axis signals from the transform circuit means to provide a mixed signal to provide the signal indicative of the rotational position of the rotor.

19. The motor drive of claim 17 wherein the drive means includes a current regulated inverter connected to provide power to a motor.

20. The motor drive of claim 19 including controller means for controlling the power applied by the inverter to a motor to control its speed and torque, the controller means receiving input signals indicating the desired speed and torque of the motor, and also receiving the signal indicative of the rotational position of the rotor, and for providing output signals to the current regulated inverter which indicate the desired output currents.

21. The motor drive of claim 18 wherein the drive means comprises an inverter connected to the stator windings to provide the AC drive power on supply lines to the stator windings at the fundamental frequency and signal generators coupled to the supply lines to provide power to the stator windings at the signal frequency.

22. The motor drive of claim 18 wherein the motor is a three phase motor having three input lines, wherein the transform circuit means for transforming the detected currents to equivalent q-axis and d-axis currents provides signals $i^s_{qsi}$ and $i_{dsi}$, respectively, and the heterodyne demodulator demodulates the current signals to provide a mixed signal $\epsilon$ which is a function in accordance with the expression:

$$\epsilon = i_{qsi}{}^s \cos(2\hat{\theta}_r - \omega_i t) - i_{dsi}{}^s \sin(2\hat{\theta}_r - \omega_i t),$$

where $\hat{\theta}_r$ is an existing estimate of the rotor position and $\omega_i$ is the signal frequency, and a low pass filter which filters the signal e to provide a filtered signal $\epsilon_f$ which is a function in accordance with the expression $$\epsilon_f = I_{il} \sin[2(\theta_r - \hat{\theta}_r)]$$

where $I_{il}$ is an equivalent current level and $\theta_r$ is the actual rotor position.

23. The motor drive of claim 22 wherein the measuring means further includes an observer controller receiving the filtered signal $\epsilon_f$, and a model of the mechanical system of the motor, the observer controller providing a selectively weighted and conditioned version of the signal $\epsilon_f$ to the mechanical system model, the mechanical system model also receiving a torque input signal and providing output signals which are estimates of rotor speed $\hat{\omega}_r$ and position $\hat{\theta}_r$, the position estimate $\hat{\theta}_r$ being fed back to the means for heterodyning.

24. A method of determining the rotational position of an AC motor comprising the steps of:
(a) providing a polyphase motor including a stator with a plurality of stator windings thereon, and a rotor mounted for rotation within the stator, the rotor constructed to provide impedance as seen by the stator windings which varies as a periodic function of the rotational position of the rotor;
(b) providing balanced AC drive power to the stator windings at a fundamental drive frequency of the motor;
(c) providing balanced AC power to the stator windings at a signal frequency which is substantially higher than the drive frequency; and
(d) measuring the response of the stator windings to the signal frequency power to determine the variation of the response as a function of time during operation of the motor whereby the angular position of the rotor as a function of time or the speed of the rotor or both can be determined from the variation of the response during operation of the motor.

25. The method of claim 24 wherein the step of measuring the response of the stator windings includes the steps of mixing a signal which is a function of the high signal frequency with the current from the stator windings and low pass filtering the mixed signal to provide a signal indicative of the rotational position of the rotor.

26. The method of claim 24 wherein the motor is a three phase motor having three input lines, wherein the step of measuring the response includes the steps of detecting the currents in the input lines to the motor, transforming the detected currents to equivalent q-axis and d-axis current signals $i^s_{qsi}$ and $i^s_{dsi}$, respectively, heterodyning the current signals to provide a mixed signal $\epsilon$ which is a function in accordance with the expression:

$$\epsilon = i_{qsi}{}^s \cos(2\hat{\theta}_r - \omega_i t) - i_{dsi}{}^s \sin(2\hat{\theta}_r - \omega_i t),$$

where $\hat{\theta}_r$ is an existing estimate of the rotor position and $\omega_i$ is the signal frequency, and low pass filtering the signal $\epsilon$ to provide a filtered signal $\epsilon_f$ which is a function in accordance with the expression $$\epsilon_f = I_{il} \sin[2(\theta_r - \hat{\theta}_r)]$$

where $I_{il}$ is a current amplitude and $\theta_r$ is the actual rotor position.

27. The method of claim 26 including the step of providing a selectively weighted and conditioned version of the signal $\epsilon_f$ to a mechanical system model for the motor and also providing a torque input signal to the mechanical system model, and providing output signals from the model which are estimates of rotor speed $\hat{\omega}_r$ and position $\hat{\theta}_r$, and feeding back the position estimate $\hat{\theta}_r$ to the step of heterodyning.

28. A motor drive system comprising:
(a) a linear motor including a primary and a secondary, the primary and secondary movable linearly with respect to each other, the secondary magnetically coupled to the primary to provide impedance as seen by the primary which varies as a function of the relative position of the primary and secondary;
(b) drive means, connected to the primary, for providing AC drive power to the primary at a fundamental drive frequency of the motor and for also providing power to the primary at a signal frequency which is substantially higher than the drive frequency; and
(c) means for measuring the response of the primary to the signal frequency power to determine the variation of the response as a function of time during operation of the motor whereby the relative linear position of the primary and secondary can be determined.

29. The motor drive system of claim 28 wherein the secondary is constructed to have a leakage inductance which varies as a function of the relative position of the secondary and primary at the signal frequency to provide impedance as seen by the primary which varies with relative position.

30. The motor drive system of claim 28 wherein the drive means includes an inverter having a plurality of switching devices connected in a bridge configuration and control means for controlling the switching of the switching devices to provide AC power to the primary, wherein the control means controls the switching of the switching devices of the inverter in a pulse width modulated manner at a high switching frequency to provide pulse width modulated output power which includes a component at the fundamental drive frequency and a component at the high signal frequency.

31. The motor drive system of claim 28 wherein the means for measuring the response of the primary to signal frequency power includes a heterodyne demodulator mixing a signal which is a function of the high signal frequency with the response from the primary to provide a signal indicative of the relative position of the primary and secondary.

* * * * *

UNITED STATES PATENT AND TRADEMARK OFFICE
CERTIFICATE OF CORRECTION

PATENT NO. : 5,585,709
DATED : December 17, 1996
INVENTOR(S) : Jansen, et al.

It is certified that error appears in the above-indentified patent and that said Letters Patent is hereby corrected as shown below:

In column 5, line 19 of the patent, "line 34)" should be --line 34).--.

In column 5, line 20 of the patent, "$i^s_{gdsi}$" should be --$i^s_{qdsi}$--.

In column 5, line 20 of the patent, "$i^s_{qdsi}$" should be --$i^s_{qsi}$--.

In column 5, line 40 of the patent, "$T^*_c$" should be --$T^*_e$--.

In column 6, line 6 of the patent, "$T^*_c$" should be --$T^*_e$--.

In column 6, line 12 of the patent, "$T^*_c$" should be --$T^*_e$--.

In column 6, line 17 of the patent, "$T^*_c$" should be --$T^*_e$--.

In column 6, line 23 of the patent, "$i^{c*}_{qs1}$" should be --$i^{e*}_{qs1}$--.

In column 8, line 7 of the patent, "$i^s_{qsi}{}^s$" should be --$i^s_{qsi}$--.

UNITED STATES PATENT AND TRADEMARK OFFICE
CERTIFICATE OF CORRECTION

PATENT NO. : 5,585,709
DATED : December 17, 1996
INVENTOR(S) : Jansen, et al.

Page 2 of 4

It is certified that error appears in the above-indentified patent and that said Letters Patent is hereby corrected as shown below:

In column 8, line 25 of the patent, "$\hat{T}_c$," should be -- $\hat{T}_e$, --.

In column 8, line 27 of the patent, "$T^*_c$" should be --$T^*_e$--.

In column 8, line 42 of the patent, "Used." should be --used.--.

In column 9, line 31 of the patent, "$\omega_c$" should be --$\omega_e$--.

In column 9, line 46 of the patent, "$\omega_c$" should be --$\omega_e$--.

In column 9, line 56 of the patent, "$i^s_{qsl}$" should be --$i^s_{qsi}$--.

In column 9, line 58 of the patent, "$V^s_{qsl}$" should be --$V^s_{qsi}$--.

In column 9, line 66 of the patent, "$V^s_{qsl}$" should be --$V^s_{qsi}$--.

In column 19, line 19 of the patent, "thus-any" should be --thus any--.

UNITED STATES PATENT AND TRADEMARK OFFICE
CERTIFICATE OF CORRECTION

PATENT NO. : 5,585,709
DATED : December 17, 1996
INVENTOR(S) : Jansen, et al.

Page 3 of 4

It is certified that error appears in the above-indentified patent and that said Letters Patent is hereby corrected as shown below:

In column 19, line 30 of the patent, "relative-to" should be --relative to--.

In column 21, line 28 of the patent, "acting-as" should be --acting as--.

In column 21, line 33 of the patent, "Similarly" should be --Similarly,--.

In column 21, line 37 of the patent, "273 The" should be --273. The--.

In column 21, line 40 of the patent, "$i_{dsi}^{stl}$." should be --$i_{dsi}$.--.

In column 23, line 21 of the patent, "respectively" should be --respectively,--.

In column 23, line 66 of the patent, "$i^s_{dsi}$]." should be --$i^s_{ds1}$].--.

In column 26, line 63 of the patent, "$i^s_{qsi}{}^s$ and $i_{dsi}$," should be --$i^s_{qsi}$ and $i^s_{dsi}$,--.

In column 27, line 16 of the patent, "signal to" should be --signal $\epsilon_f$ to--.

UNITED STATES PATENT AND TRADEMARK OFFICE
CERTIFICATE OF CORRECTION

PATENT NO. : 5,585,709
DATED : December 17, 1996
INVENTOR(S) : Jansen, et al.

It is certified that error appears in the above-identified patent and that said Letters Patent is hereby corrected as shown below:

In column 29, line 35 of the patent, "$i^s_{qsi}$ and $i_{dsi}$," should be --$i^s_{qsi}$ and $i^s_{dsi}$,--.

In column 29, line 44 of the patent, "signal e" should be --signal $\epsilon$--.

Signed and Sealed this

Seventeenth Day of February, 1998

Attest:

BRUCE LEHMAN

*Attesting Officer*  *Commissioner of Patents and Trademarks*